(12) United States Patent
Lee et al.

(10) Patent No.: US 11,494,544 B2
(45) Date of Patent: Nov. 8, 2022

(54) INTEGRATED CIRCUIT INCLUDING CELLS OF DIFFERENT HEIGHTS AND METHOD OF DESIGNING THE INTEGRATED CIRCUIT

(71) Applicant: SAMSUNG ELECTRONICS CO., LTD., Suwon-si (KR)

(72) Inventors: Bonghyun Lee, Suwon-si (KR); Jungho Do, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/183,630

(22) Filed: Feb. 24, 2021

(65) Prior Publication Data

US 2022/0058326 A1 Feb. 24, 2022

(30) Foreign Application Priority Data

Aug. 18, 2020 (KR) ........................ 10-2020-0103437

(51) Int. Cl.
*G06F 30/00* (2020.01)
*G06F 30/392* (2020.01)
*H01L 27/02* (2006.01)
*H01L 23/528* (2006.01)

(52) U.S. Cl.
CPC ........ *G06F 30/392* (2020.01); *H01L 23/5286* (2013.01); *H01L 27/0207* (2013.01)

(58) Field of Classification Search
CPC ............... G06F 30/392; H01L 23/5286; H01L 27/0207
See application file for complete search history.

(56) References Cited

U.S. PATENT DOCUMENTS

| | | | |
|---|---|---|---|
| 6,177,691 B1 * | 1/2001 | Iranmanesh | G11C 5/14 257/390 |
| 7,800,409 B2 | 9/2010 | Pitts | |
| 7,802,219 B2 | 9/2010 | Tomar et al. | |
| 8,276,109 B2 | 9/2012 | Penzes et al. | |
| 8,631,377 B2 | 1/2014 | Lee et al. | |
| 9,007,095 B2 | 4/2015 | Penzes | |
| 2020/0034512 A1 | 1/2020 | Zhuang et al. | |
| 2020/0051977 A1 * | 2/2020 | Lim et al. | H01L 27/0924 |

FOREIGN PATENT DOCUMENTS

| | | | | |
|---|---|---|---|---|
| KR | 10-2019-0087752 A | | 7/2019 | |
| TW | 202105232 A | * | 2/2021 | ........... G06F 30/392 |

* cited by examiner

*Primary Examiner* — Naum Levin
(74) *Attorney, Agent, or Firm* — Sughrue Mion, PLLC

(57) ABSTRACT

An integrated circuit includes a first column including a plurality of first cells aligned and placed in a plurality of first rows, each first row having a first width and extending in a first horizontal direction, a second column including a plurality of second cells aligned and placed in a plurality of second rows, each second row having a second width and extending in the first horizontal direction, and an interface column extending in a second horizontal direction perpendicular to the first horizontal direction between the first column and the second column, wherein the interface column includes at least one well tap configured to provide a first supply voltage to a well, and at least one substrate tap configured to provide a second supply voltage to a substrate.

20 Claims, 22 Drawing Sheets

INTEGRATED CIRCUIT INCLUDING CELLS OF DIFFERENT HEIGHTS AND METHOD OF DESIGNING THE INTEGRATED CIRCUIT

CROSS-REFERENCE TO THE RELATED APPLICATION

This application is based on and claims priority under 35 U.S.C. § 119 to Korean Patent Application No. 10-2020-0103437, filed on Aug. 18, 2020, in the Korean Intellectual Property Office, the disclosure of which is incorporated by reference herein in its entirety.

BACKGROUND

The disclosure relates to an integrated circuit (IC) and, more particularly, to an IC including cells of different heights and a method of designing the IC.

An IC may have a high level of integration due to the development of a semiconductor process and may also be required to have high performance. For example, small-sized devices, e.g., transistors, may reduce an area of an IC, and large-sized devices may be desirable to increase an operating speed of an IC. Therefore, to achieve functions and an operating speed required for an IC, an IC may be designed taking into account both a level of integration and performance.

SUMMARY

The disclosure provides an integrated circuit (IC) including cells of different heights to take into account both a level of integration and performance and a method of designing the IC.

In accordance with an aspect of the disclosure, an integrated circuit (IC) includes a first column in which a plurality of first cells are aligned and placed in a plurality of first rows, each first row of the plurality of first rows having a first width and extending in a first horizontal direction, the first column including a plurality of first gate electrodes extending, at a first pitch, in a second horizontal direction perpendicular to the first horizontal direction; a second column in which a plurality of second cells are aligned and placed in a plurality of second rows, each second row of the plurality of second rows having a second width and extending in the first horizontal direction, the second column including a plurality of second gate electrodes extending in the second horizontal direction at a second pitch; and an interface column extending in the second horizontal direction between the first column and the second column, the interface column including at least one interface gate electrode extending in the second horizontal direction, wherein the at least one interface gate electrode includes at least one of a first interface gate electrode spaced apart from an outer one of the plurality of first gate electrodes by the first pitch; and a second interface gate electrode spaced apart from an outer one of the plurality of second gate electrodes by the second pitch.

In accordance with an aspect of the disclosure, an integrated circuit (IC) includes a first column including a plurality of first power rails, each first power rail of the plurality of first power rails being configured to provide a first supply voltage or a second supply voltage to a plurality of first cells and extending in a first horizontal direction at a first pitch; a second column including a plurality of second power rails configured to provide the first supply voltage or the second supply voltage to a plurality of second cells and extending in the first horizontal direction at a second pitch; and an interface column extending in a second horizontal direction perpendicular to the first horizontal direction between the first column and the second column, wherein the interface column includes a first power line connected to a first group of the plurality of first power rails and extending in the second horizontal direction, the first group of the plurality of first power rails being configured to provide the first supply voltage; a second power line connected to a first group of the plurality of second power rails and extending in the second horizontal direction, the first group of the plurality of second power rails being configured to provide the first supply voltage; and at least one first conductive pattern extending in the first horizontal direction and connecting the first power line to the second power line.

In accordance with an aspect of the disclosure, an integrated circuit (IC) includes a first column including a plurality of first cells aligned in a plurality of first rows, each first row of the plurality of first rows having a first width and extending in a first horizontal direction; a second column including a plurality of second cells aligned in a plurality of second rows, each second row of the plurality of second rows having a second width and extending in the first horizontal direction; and an interface column extending in a second horizontal direction perpendicular to the first horizontal direction between the first column and the second column, wherein the interface column includes at least one well tap configured to provide a first supply voltage to a well; and at least one substrate tap configured to provide a second supply voltage to a substrate.

In accordance with an aspect of the disclosure, a method of designing an integrated circuit, the method being performed by at least one processor configured to execute a series of instructions, includes obtaining input data defining a plurality of first cells each having a first height and a plurality of second cells each having a second height; defining at least one first column in which the plurality of first cells are aligned and placed in a plurality of first rows, the plurality of first rows extending in a first horizontal direction, and at least one second column in which the plurality of second cells are aligned and placed in a plurality of second rows, the plurality of second rows extending in the first horizontal direction; and placing pre-placement cells in at least one interface column, the at least one interface column extending in a second horizontal direction perpendicular to the first horizontal direction between the at least one first column and the at least one second column.

BRIEF DESCRIPTION OF THE DRAWINGS

Embodiments of the disclosure will be more clearly understood from the following detailed description taken in conjunction with the accompanying drawings in which.

DETAILED DESCRIPTION OF EMBODIMENTS

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

Figure 1:
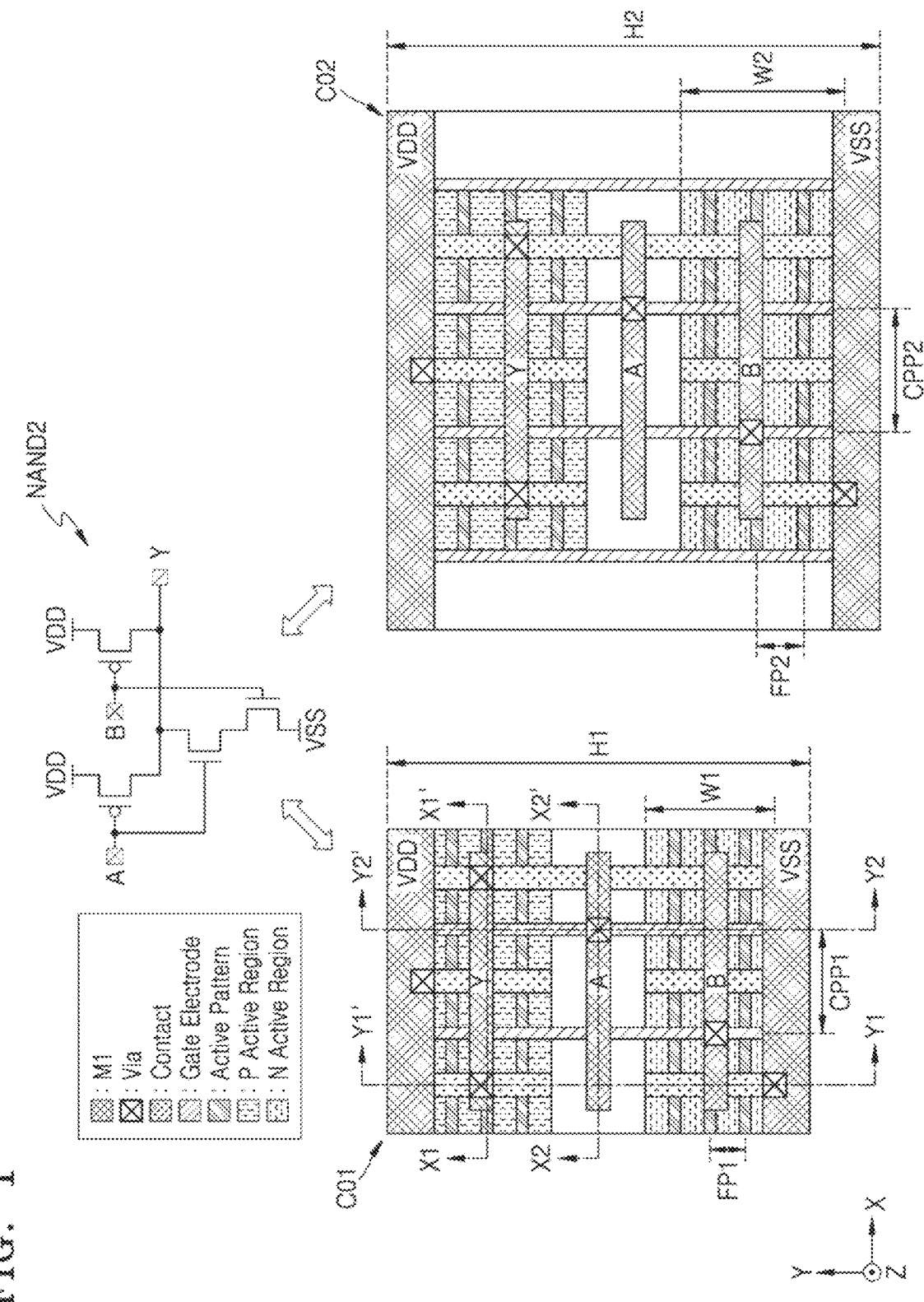
FIG. 1 is a view of cells according to an embodiment.
Figure 2:
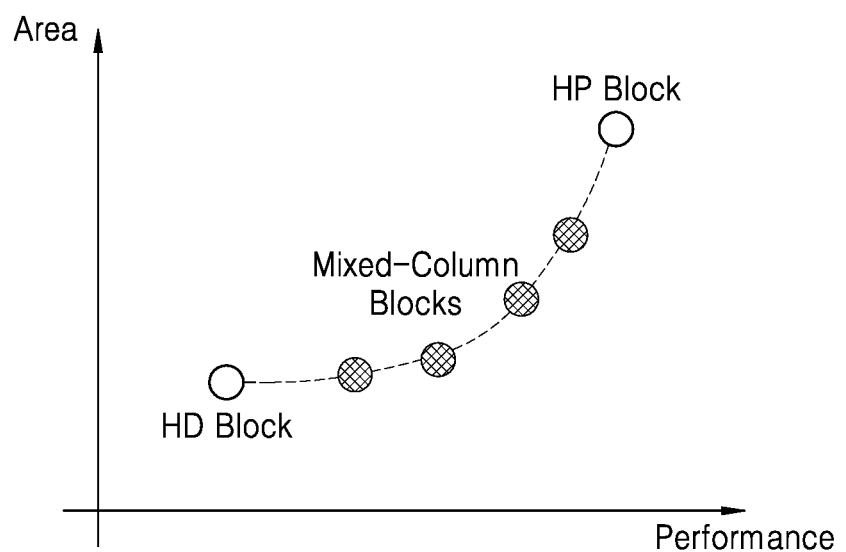
FIG. 2 is a graph showing a relationship between performance and an area of an integrated circuit (IC), according to an embodiment.

FIG. 1 is a view of cells according to an example embodiment of the disclosure, and FIG. 2 is a graph showing a relationship between performance and an area of an integrated circuit (IC), according to an example embodiment of the disclosure. Particularly, an upper part of FIG. 1 illustrates a circuit diagram of a two-input NAND gate NAND2, and a lower part of FIG. 1 schematically illustrates layouts of first and second cells C01 and C02 corresponding to the two-input NAND gate NAND2, on a plane formed by an X-axis and a Y-axis. Herein, an X-axis direction and a Y-axis direction may be referred to as a first horizontal direction and a second horizontal direction, respectively, and a Z-axis direction may be referred to as a vertical direction. The plane formed by the X-axis and the Y-axis may be referred to as a horizontal plane, a component placed in a +Z direction relative to another component may be referred to as a component over the other component, and a component placed in a −Z direction relative to another component may be referred to as a component below the other component. In addition, an area of a component may indicate a size occupied by the component on a plane parallel to the horizontal plane, a width of the component may indicate a length in a direction orthogonal to a direction in which the component extends, and a height of the component may indicate a length of the component in the Y-axis direction. In the drawings herein, only some layers may be shown for convenience of illustration. To indicate a connection between a pattern of a wiring layer and a lower pattern, a via may be shown even though the via is below the pattern of the wiring layer. Also, a pattern composed of a conductive material, such as a pattern of the wiring layer, may be referred to as a conductive pattern, or may be simply referred to as a pattern.

An IC may include a plurality of cells. A cell may be a unit of a layout included in an IC, may be designed to perform a pre-defined function, and may be referred to as a standard cell. An IC may include a plurality of various cells, and the cells may be aligned along a plurality of rows. For example, as shown in FIG. 1, the first and second cells C01 and C02 may be placed in rows extending in the X-axis direction, respectively. That is, the first cell C01 may be placed in a row having a width (hereinafter may be referred to as a first width) matching a first height H1, and the second cell C02 may be placed in a row having a width (hereinafter may be referred to as a second width) matching a second height H2. Patterns to which a positive supply voltage VDD and a negative supply voltage VSS (or a ground potential) are respectively applied at a boundary between rows may extend in the X-axis direction, and the patterns and vias connecting the patterns may be collectively referred to as a power rail. In addition, an active region in which a P-type transistor is formed and an active region in which an N-type transistor is formed may extend in the X-axis direction. A cell placed in a single row may be referred to as a single height cell (for example, first and second cells C01 and C02), and a cell continuously placed in two or more adjacent rows may be referred to as a multi-height cell (for example, some cells C15 and C26 of FIG. 4B).

As shown in FIG. 1, at least one active pattern in an active region may extend in the X-axis direction, and the active pattern may form a transistor by intersecting with a gate electrode extending in the Y-axis direction. When a fin-shaped active pattern extends in the X-axis direction, a transistor formed by the active pattern and a gate electrode may be referred to as a fin field effect transistor (FinFET). As described below with reference to FIGS. 3A to 3D, example embodiments of the disclosure will be described mainly with reference to cells including a FinFET, but it would be understood that example embodiments of the disclosure may also be applied to cells including a transistor having a different structure from the FinFET. For example, an active pattern may include a plurality of nanosheets separated from each other in the Z-axis direction and extending in the X-axis direction, and a cell may include a multi-bridge channel FET (MBCFET) formed by the plurality of nanosheets and a gate electrode. Alternatively, the cell may include a ForkFET having a structure in which an N-type transistor is relatively close to a P-type transistor by isolating nanosheets for the P-type transistor from nanosheets for the N-type transistor by a dielectric wall. Alternatively, the cell may include a vertical FET (VFET) having a structure in which source/drain regions are separated from each other in the Z-axis direction with a channel region therebetween, and a gate electrode encompasses the channel region. Alternatively, the cell may include an FET such as a complementary FET (CFET), a negative CFET (NCFET), or a carbon nanotube (CNT) FET, or include a bipolar junction transistor or another three-dimensional transistor.

Referring to FIG. 1, the two-input NAND gate NAND2 may have first and second inputs A and B and an output Y and include two n-type FETs (NFETs) and two p-type FETs (PFETs). The first and second cells C01 and C02 may provide the same function but have different performances. For example, the first and second cells C01 and C02 may generate the output Y by performing a NAND logic operation on the first and second inputs A and B and have different driving strengths and operating speeds. For example, the second cell C02 may have a larger area than the first cell C01 and provide a higher driving strength and operating speed than the first cell C01. Herein, a cell having a relatively small area, such as the first cell C01, may be referred to as a high density (HD) cell, and a region and a block in which HD cells are placed may be referred to as an HD region and an HD block, respectively. In addition, a cell providing a relatively high performance, such as the second cell C02, may be referred to as a high performance (HP) cell, and a region and a block in which HP cells are placed may be referred to as an HP region and an HP block, respectively. As shown in FIG. 1, the first cell C01 as an HD cell may have a first height H1 as a length in the Y-axis direction, and the second cell C02 as an HP cell may have a second height H2, greater than the first height H1, as a length in the Y-axis direction (H2>H1). Accordingly, the first cell C01 may be placed in rows having the first width, and the second cell C02 may be placed in rows having the second width. In this case, the width of a row may be defined as its dimension in the Y-axis direction as shown in FIG. 1.

Referring to FIG. 2, an HD block including only HD cells may have the smallest area and provide the lowest performance, whereas an HP block including only HP cells may provide the highest performance and have the largest area. The HD block may include HD cells placed in rows having a relatively small width, e.g., equal to the first height H1, and the HP block may include HP cells placed in rows having a relatively large width, e.g., equal to the second height H2. An IC may have requirements including performance higher than the performance provided by the HD block and an area smaller than the area of the HP block, and accordingly, as shown in FIG. 2, mixed-column blocks may be employed. That is, each of the mixed-column blocks may include columns (may be referred to as HD columns) in which HD cells (e.g., C01 in FIG. 1) are placed and columns (may be referred to as HP columns) in which HP cells (e.g., C02 in FIG. 1) are placed, and accordingly, the performance and the area corresponding to the requirements of an IC may be provided.

Referring back to FIG. 1, the first and second cells C01 and C02 may have different heights as well as at least one different structure. For example, as shown in FIG. 1, a pitch CPP2 between gate electrodes extending in the Y-axis direction in the second cell C02 may be greater than a pitch CPP1 between gate electrodes extending in the Y-axis direction in the first cell C01 (CPP2>CPP1), and a pitch FP2 between active patterns extending in the X-axis direction in the second cell C02 may be greater than a pitch FP1 between active patterns extending in the X-axis direction in the first cell C01 (FP2>FP1). In addition, a width W2 of an active region extending in the X-axis direction in the second cell C02 may be greater than a width W1 of an active region extending in the X-axis direction in the first cell C01. In addition, as shown in FIG. 1, the first cell C01 may be terminated by a single diffusion break (SDB) extending in the Y-axis direction and having a width of a gate electrode, while the second cell C02 may be terminated by a double diffusion break (DDB) extending in the Y-axis direction and having a width of CPP2. In some embodiments, patterns of a first wiring layer M1 as the lowest wiring layer may extend in a single direction, that is, the X-axis direction, in the first cell C01, and may extend in the X-axis direction and the Y-axis direction in the second cell C02.

In the mixed-column block of FIG. 2, the HD column and the HP column may include different structures, and accordingly, it may be important to efficiently interface the HD column and the HP column. As described below with reference to the drawings, an interface column may be placed between the HD column and the HP column, and the interface column may include a structure for interfacing the HD column and the HP column. Also, pre-placement cells may be placed in the interface column. Accordingly, a mixed-column block providing an optimal area and performance may be achieved, and an IC satisfying a performance requirement and having a high level of integration may be provided. In addition, the mixed-column block may be easily designed, and accordingly, a time-to-market of the IC satisfying the requirements may be remarkably reduced.

Figure 3A:
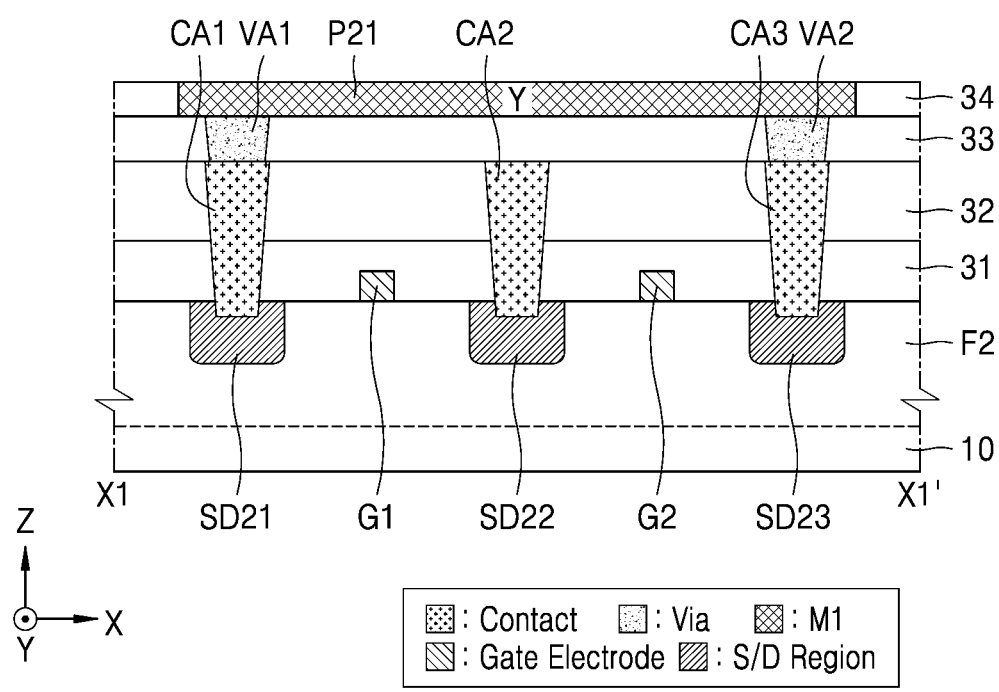
FIGS. 3A to 3D are cross-sectional views of structures of a cell according to an embodiment.
Figure 3B:
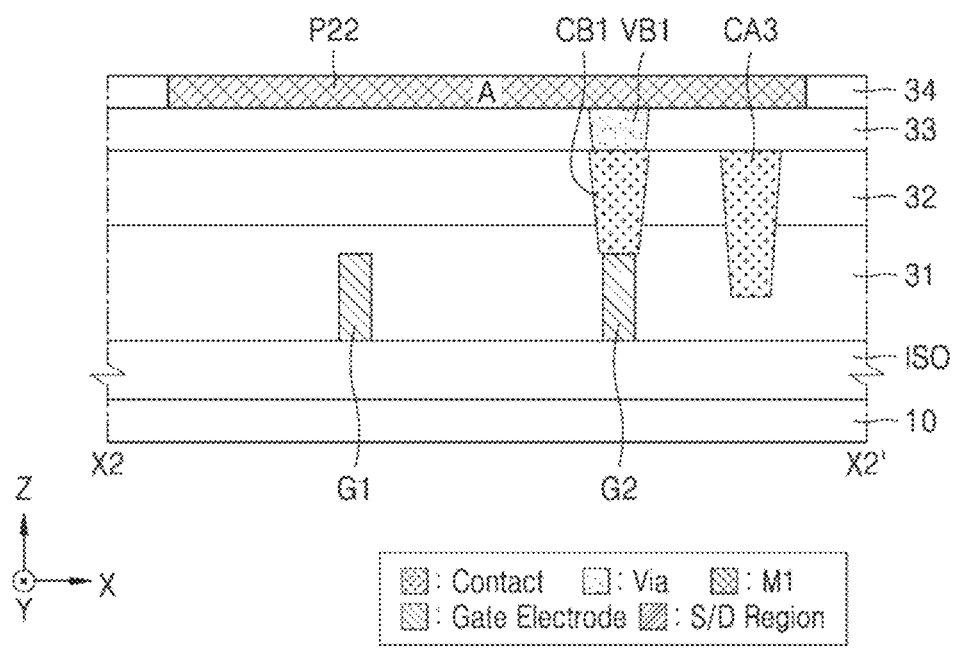
Figure 3C:
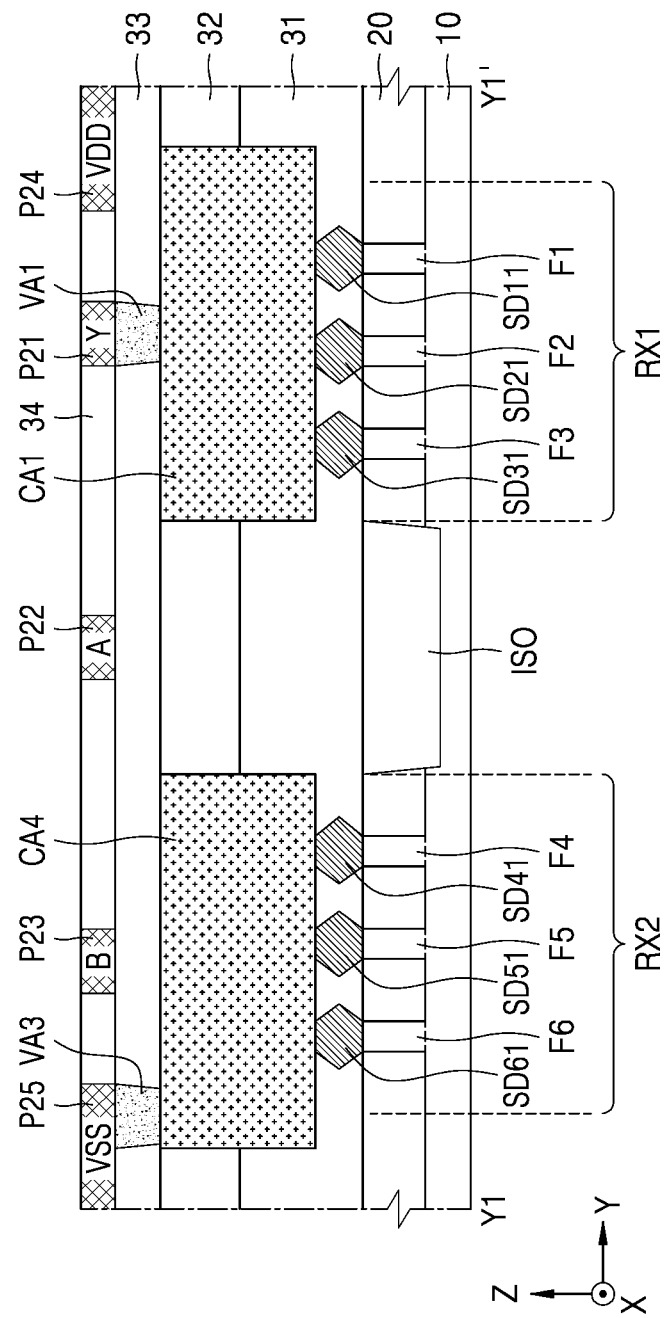
Figure 3D:
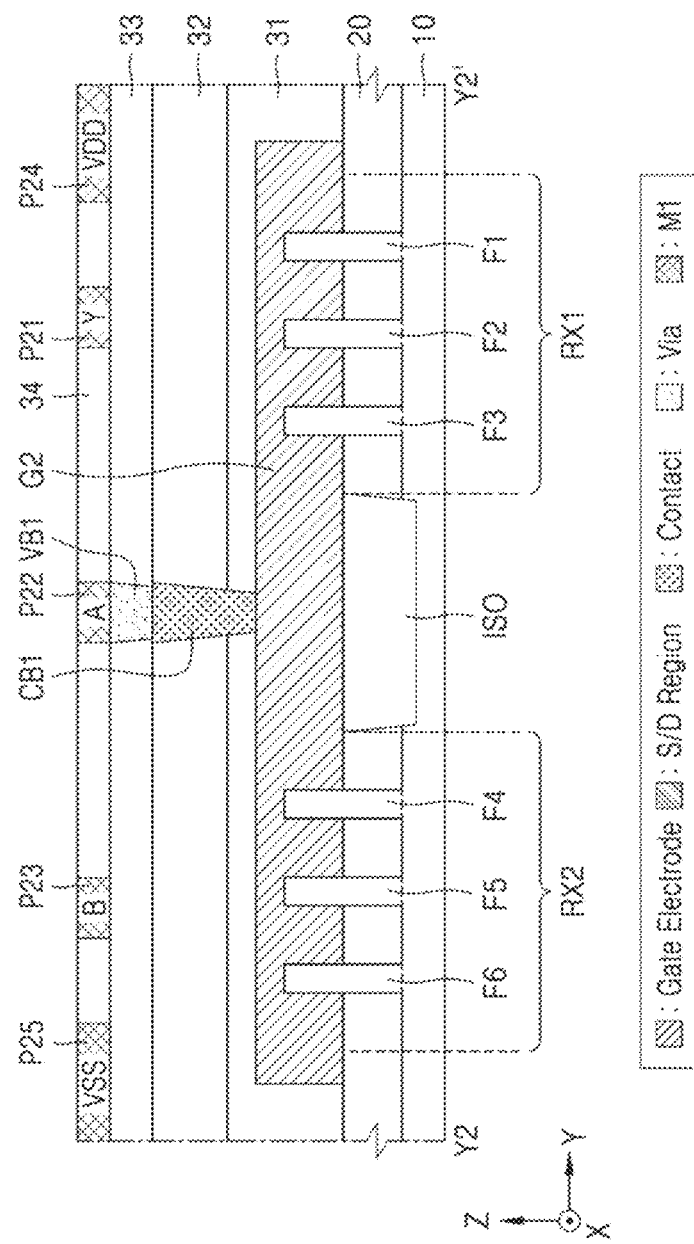

FIGS. 3A to 3D are cross-sectional views of structures of a cell according to an example embodiment of the disclosure. Particularly, the cross-sectional view of FIG. 3A shows a cross-section of the first cell C01 taken along line X1-X1' of FIG. 1, the cross-sectional view of FIG. 3B shows a cross-section of the first cell C01 taken along line X2-X2' of FIG. 1, the cross-sectional view of FIG. 3C shows a cross-section of the first cell C01 taken along line Y1-Y1' of FIG. 1, and the cross-sectional view of FIG. 3D shows a cross-section of the first cell C01 taken along line Y2-Y2' of FIG. 1. A gate spacer may be formed on a side of a gate electrode, and a gate dielectric film may be formed between the gate electrode and the gate spacer and on a lower surface of the gate electrode. In addition, a barrier film may be formed on a surface of a contact and/or a via. Hereinafter, FIGS. 3A to 3D will be described with reference to FIG. 1, and descriptions already presented with regard to FIG. 1 will be omitted.

Referring to FIG. 3A, a substrate 10 may include bulk silicon or a silicon-on-insulator (SOI), and as a non-limited example, the substrate 10 may include silicon germanium (SiGe), silicon germanium on insulator (SGOI), indium antimonide (InSb), a lead telluride (PbTe) compound, indium arsenide (InAs), phosphide, gallium arsenide (GaAs), gallium antimonide (GaSb), or the like. A second fin F2 may extend on the substrate 10 in the X-axis direction, and first to third source/drain regions SD21 to SD23 may be formed on the second fin F2. First to fourth interlayer insulating layers 31 to 34 may be formed on the second fin F2. The first and second source/drain regions SD21 and SD22 may form a transistor, i.e., a p-type field effect transistor (PFET), with a first gate electrode G1, and the second and third source/drain regions SD22 and SD23 may form a PFET with a second gate electrode G2.

First to third source/drain contacts CA1 to CA3 may be connected to the first to third source/drain regions SD21 to SD23 respectively by passing through the second interlayer insulating layer 32. In some embodiments, at least one of the first to third source/drain contacts CA1 to CA3 may be formed as a lower source/drain contact passing through the first interlayer insulating layer 31 and an upper source/drain contact passing through the second interlayer insulating layer 32. First and second source/drain vias VA1 and VA2 may be respectively connected to the first and third source/drain contacts CA1 and CA3 by passing through the third interlayer insulating layer 33, and commonly connected to an output pin P21 formed in the first wiring layer M1. Accordingly, the output pin P21 may be electrically connected to the first source/drain region SD21 through the first source/drain via VA1 and the first source/drain contact CA1 and electrically connected to the third source/drain region SD23 through the second source/drain via VA2 and the third source/drain contact CA3. A layer in which the first and second source/drain vias VA1 and VA2 are formed may be referred to as a first via layer, and a layer in which the output pin P21 and the fourth interlayer insulating layer 34 are formed may be referred to as the first wiring layer M1.

As shown in FIG. 3B, a device isolation layer ISO may be formed on the substrate 10. The device isolation layer ISO may isolate active regions from each other as described below with reference to FIGS. 3C and 3D. The first to fourth interlayer insulating layers 31 to 34 may be formed on the device isolation layer ISO, and the third source/drain contact CA3 may pass through the second interlayer insulating layer 32. A first gate contact CB1 may be connected to the second gate electrode G2 by passing through the second interlayer insulating layer 32, and a first gate via VB1 may be connected to the first gate contact CB1 and a first input pin P22 by passing through the third interlayer insulating layer 33. Accordingly, the first input pin P22 may be electrically connected to the second gate electrode G2 through the first gate via VB1 and the first gate contact CB1. In some embodiments, unlike as shown in FIG. 3B, the first gate contact CB1 may be omitted, and the first input pin P22 may be electrically connected to the second gate electrode G2 through a gate via passing through the second and third interlayer insulating layers 32 and 33.

Referring to FIG. 3C, a field insulating layer 20 may be formed on the substrate 10. The field insulating layer 20 may include, as a non-limited example, silicon dioxide (SiO$_2$), silicon nitride (SiN), silicon oxynitride (SiON), silicon oxycarbonitride (SiOCN), or a combination of two or more thereof. In some embodiments, the field insulating layer 20 may encompass some of side surfaces of an active pattern, i.e., a fin, as shown in FIG. 3C. The first to fourth interlayer insulating layers 31 to 34 may be formed on the field insulating layer 20. First to sixth fins F1 to F6 may extend in the X-axis direction in the field insulating layer 20, and six source/drain regions SD11 to SD61 may be formed on the first to sixth fins F1 to F6, respectively. The device isolation layer ISO may extend, in the X-axis direction, between the first to third fins F1 to F3 and the fourth to sixth fins F4 to F6, and first and second active regions RX1 and RX2 may be isolated by the device isolation layer ISO. In other words, the device isolation layer ISO may extend between third fin F3 and fourth fin F4 in the X-axis direction as shown in FIG. 3C.

The first source/drain contact CA1 may be connected to the three source/drain regions SD11, SD21, and SD31 by passing through the second interlayer insulating layer 32, and accordingly, the three source/drain regions SD11, SD21, and SD31 may be electrically connected to each other. In addition, a fourth source/drain contact CA4 may be connected to the three source/drain regions SD41, SD51, and SD61 by passing through the second interlayer insulating layer 32, and accordingly, the three source/drain regions SD41, SD51, and SD61 may be electrically connected to each other. The first source/drain via VA1 may be connected to the first source/drain contact CA1 by passing through the third interlayer insulating layer 33, and connected to the output pin P21. In addition, a third source/drain via VA3 may be connected to the fourth source/drain contact CA4 by passing through the third interlayer insulating layer 33, and connected to a pattern P25, which is formed in the first wiring layer M1, and to which the negative supply voltage (or the ground potential) VSS is applied. In the first wiring layer M1, a pattern P24 to which the positive supply voltage VDD is applied and the pattern P25 to which the negative supply voltage VSS is applied may extend in parallel to each other in the X-axis direction, and the output pin P21, the first input pin P22, and a second input pin P23 may also be formed in the first wiring layer M1.

Referring to FIG. 3D, the field insulating layer 20 may be formed on the substrate 10, and the first to sixth fins F1 to F6 passing through the field insulating layer 20 may intersect with the second gate electrode G2 extending in the Y-axis direction. The second gate electrode G2 may include, as a non-limited example, titanium (Ti), tantalum (Ta), tungsten (W), aluminum (Al), cobalt (Co), or a combination of two or more thereof, or include a non-metal such as Si or SiGe. In addition, the second gate electrode G2 may be formed by stacking two or more conductive materials, and may include a work function control layer including, for example, titanium nitride (TiN), tantalum nitride (TaN), titanium carbide (TiC), tantalum carbide (TaC), titanium aluminum carbide (TialC), or a combination of two or more thereof, and a filling conductive layer including W, Al, or the like.

Figure 4A:
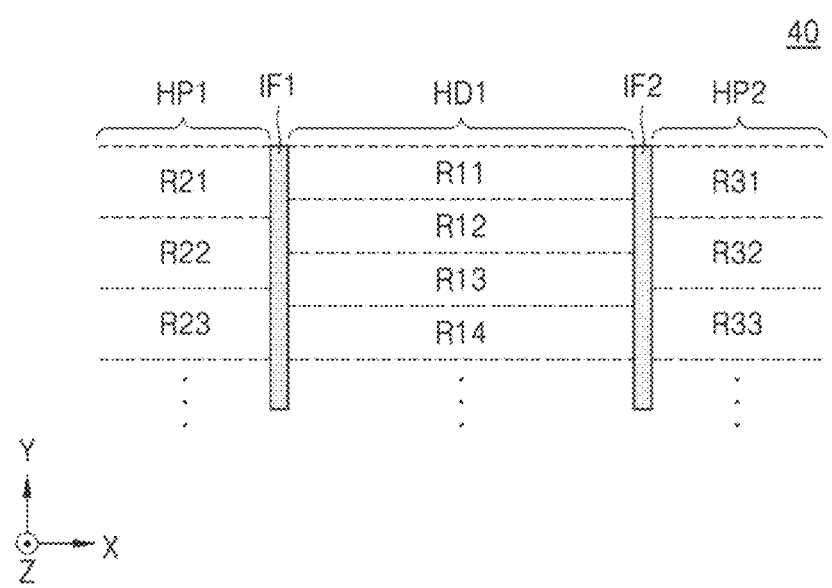
FIGS. 4A and 4B are plan views of layouts of an IC according to an embodiment.
Figure 4B:
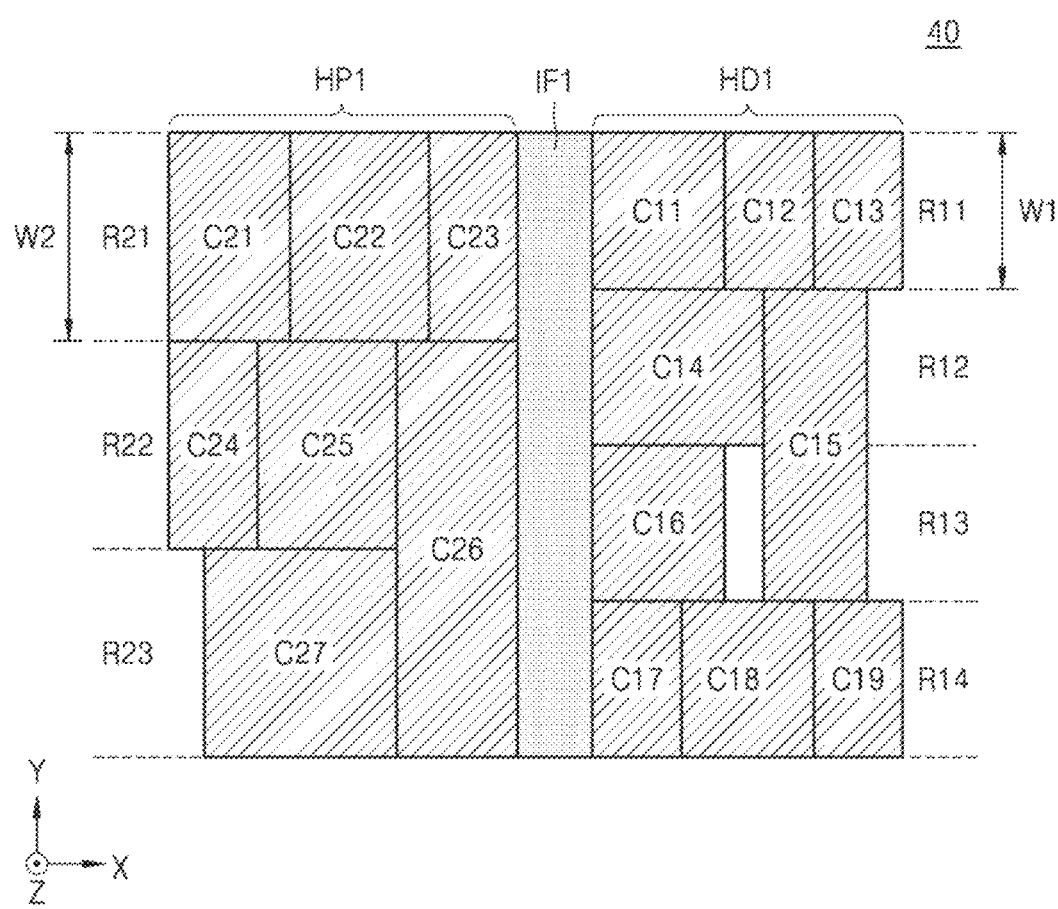

FIGS. 4A and 4B are plan views of layouts of an IC 40 according to an example embodiment of the disclosure. Particularly, the plan view of FIG. 4A shows first and second HP columns HP1 and HP2, in which HP cells are placed, and a first HD column HD1, in which HD cells are placed, in the IC 40. The plan view of FIG. 4B is an enlarged view of the first HD column HD1 and the first HP column HP1 in the IC 40.

In some embodiments, an interface column may be placed between an HD column and an HP column. For example, as shown in FIG. 4A, a first interface column IF1 extending in the Y-axis direction may be placed between the first HP column HP1 and the first HD column HD1, and a second interface column IF2 extending in the Y-axis direction may be placed between the first HD column HD1 and the second HP column HP2. In the first HP column HP1, HP cells may be aligned and placed in a plurality of rows R21, R22, R23, . . . , and in the first HD column HD1, HD cells may be aligned and placed in a plurality of rows R11, R12, R13, R14, . . . . In the second HP column HP2, HP cells may be aligned and placed in a plurality of rows R31, R32, R33, . . . . Here, the columns HP1, IF1, HD1, IF2, and HP2 may extend in the Y-axis direction and the rows R21, R22, R23, . . . , R11, R12, R13, R14, . . . , R31, R32, R33, . . . may extend in the X-axis direction.

Referring to FIG. 4B, the first interface column IF1 may extend in the Y-axis direction between the first HP column HP1 and the first HD column HD1. The first HD column HD1 may include a plurality of first cells C11 to C19 aligned and placed in a plurality of rows R11 to R14, and the plurality of first cells C11 to C19 may include single height cells C11 to C14 and C16 to C19 and a multi-height cell C15. In addition, the first HP column HP1 may include a plurality of second cells C21 to C27 aligned and placed in a plurality of rows R21, R22, and R23, and the plurality of second cells C21 to C27 may include single height cells C21 to C25 and C27 and a multi-height cell C26. The first interface column IF1 may include a structure for interfacing the plurality of first cells C11 to C19 and the plurality of second cells C21 to C27, and examples of the first interface column IF1 will be described with reference to the drawings below.

Figure 5A:
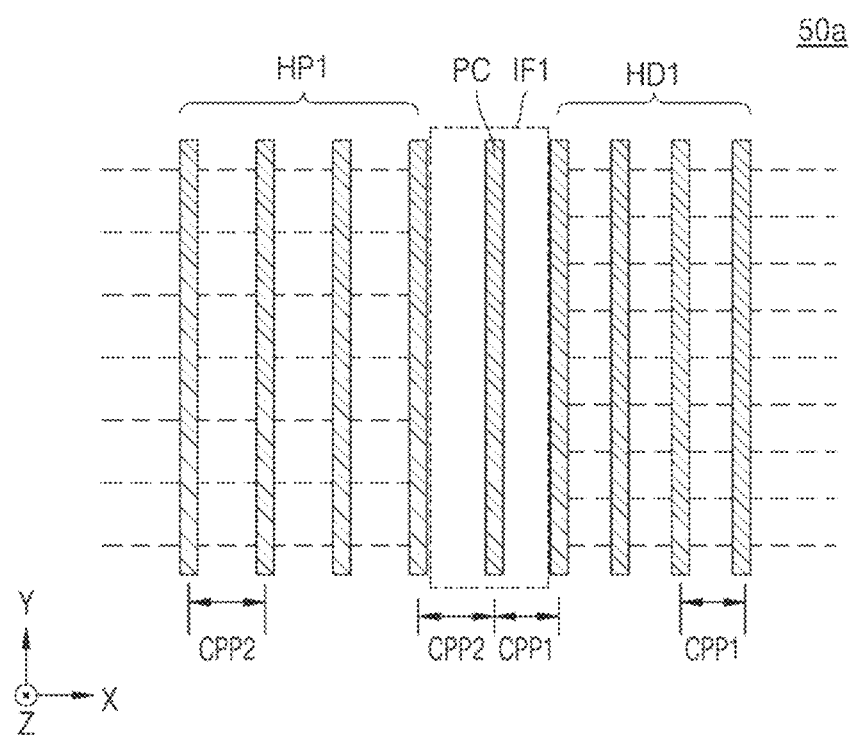
FIGS. 5A to 5C are plan views of layouts of ICs according to embodiments.
Figure 5B:
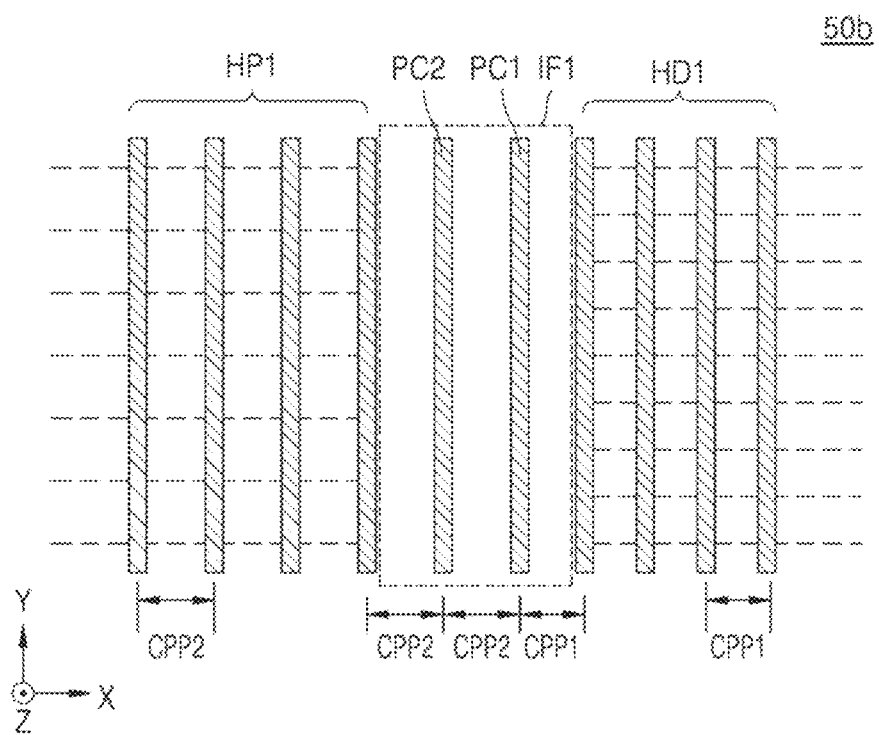
Figure 5C:
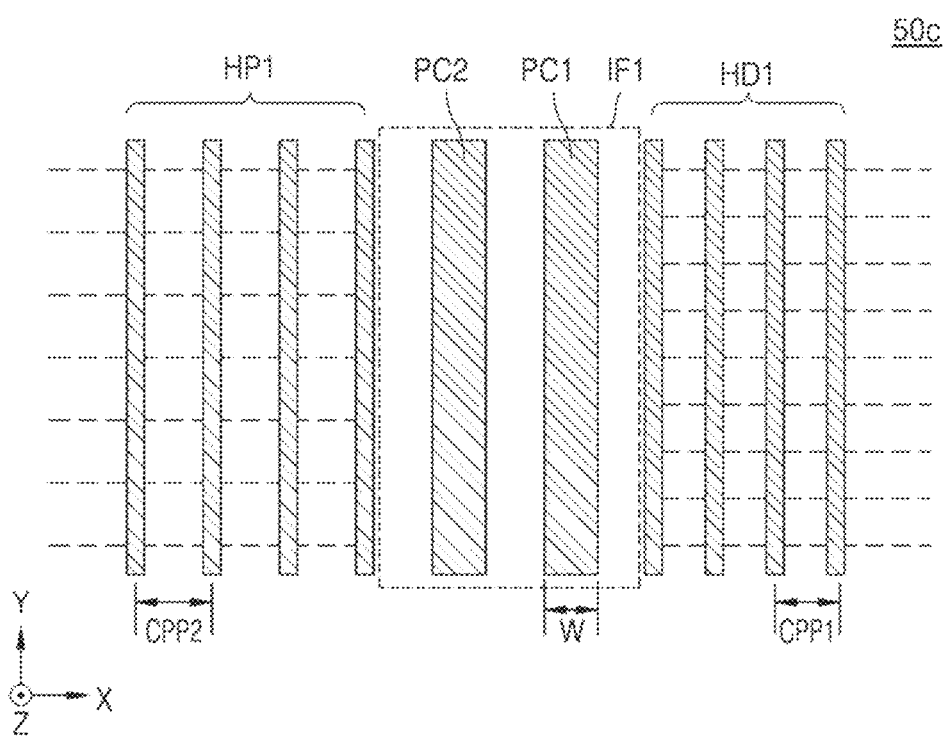

FIGS. 5A to 5C are plan views of layouts of ICs according to example embodiments of the disclosure. Particularly, the plan views of FIGS. 5A to 5C show gate electrodes in a first HD column HD1, a first interface column IF1, and a first HP column HP1. Hereinafter, overlapping descriptions in relation to FIGS. 5A to 5C will be omitted.

Referring to FIG. 5A, an IC 50*a* may include a first HP column HP1, a first interface column IF1, and a first HD column HD1. The first HD column HD1 may include gate electrodes extending in the Y-axis direction at a first pitch CPP1, and the first HP column HP1 may include gate electrodes extending in the Y-axis direction at a second pitch CPP2. The first interface column IF1 may include a gate electrode PC (i.e., an interface gate electrode) spaced apart from a gate electrode of the first HD column HD1 by the first pitch CPP1 and spaced apart from a gate electrode of the first HP column HP1 by the second pitch CPP2. Accordingly, a pitch between gate electrodes may be changed from the first HD column HD1 to the first HP column HP1 based on the position of the gate electrode PC of the first interface column IF1.

Referring to FIG. 5B, an IC 50*b* may include a first HP column HP1, a first interface column IF1, and a first HD column HD1. The first interface column IF1 may include a first gate electrode PC1 spaced apart from a gate electrode of the first HD column HD1 by a first pitch CPP1 and a second gate electrode PC2 spaced apart from a gate electrode of the first HP column HP1 by a second pitch CPP2. As shown in FIG. 5B, in the first interface column IF1, the first gate electrode PC1 and the second gate electrode PC2 may be spaced apart from each other by the second pitch CPP2 that is greater than the first pitch CPP1. In some embodiments, unlike in FIG. 5B, the first gate electrode PC1 and the second gate electrode PC2 may be spaced apart from each other by the first pitch CPP1, or may be spaced apart from each other by a pitch that is greater than the first pitch CPP1 and less than the second pitch CPP2.

Referring to FIG. 5C, an IC 50*c* may include a first HP column HP1, a first interface column IF1, and a first HD column HD1. The first interface column IF1 may include a first gate electrode PC1 and a second gate electrode PC2 each having a wider width W in the X-axis direction than widths of gate electrodes of the first HD column HD1 and gate electrodes of the first HP column HP1. For example, a plurality of active patterns extending in the X-axis direction in the first HD column HD1 may be terminated after intersecting the first gate electrode PC1, and a plurality of active patterns extending in the X-axis direction in the first HP column HP1 may be terminated after intersecting the second gate electrode PC2.

Figure 6:
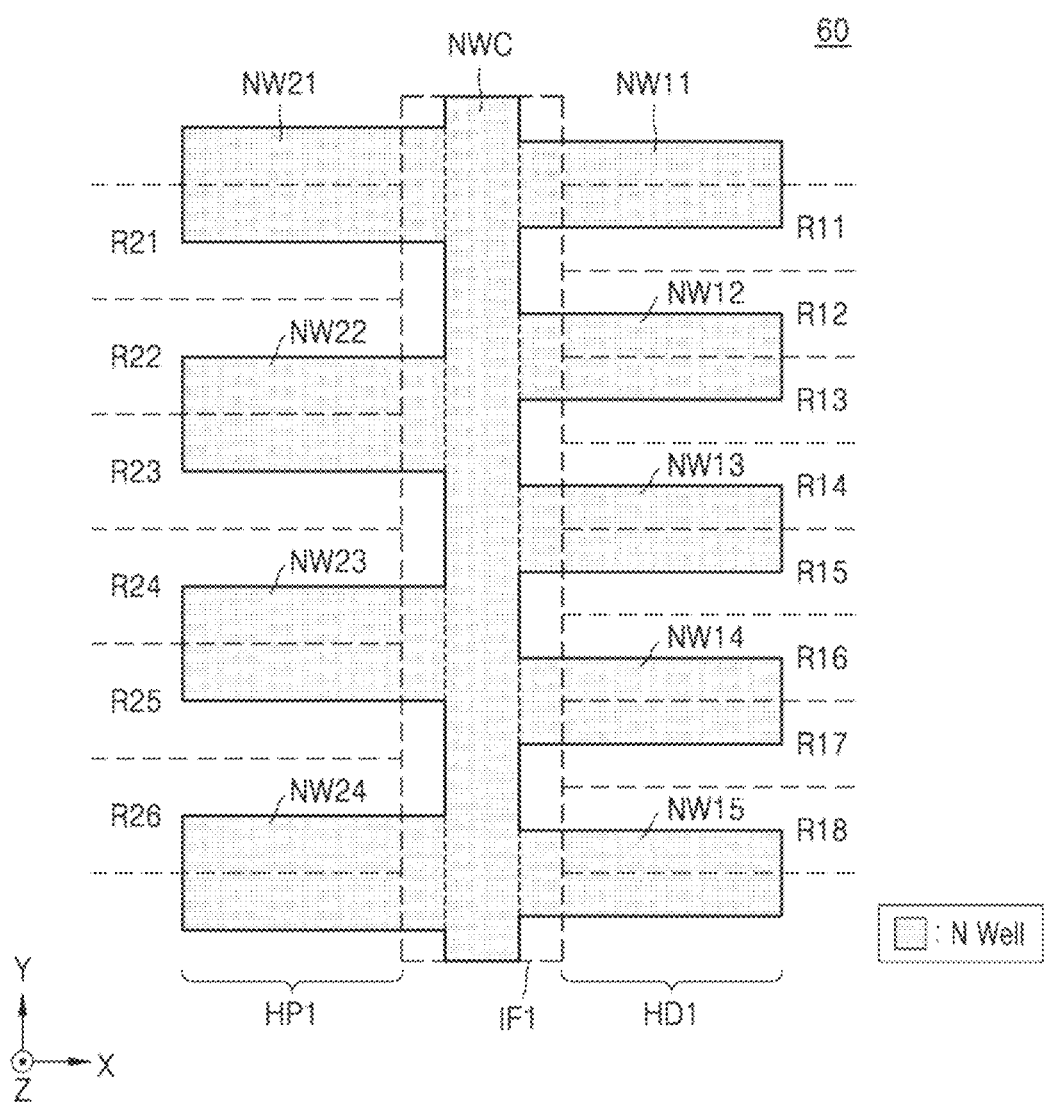
FIG. 6 is a plan view of a layout of an IC according to an embodiment.

FIG. 6 is a plan view of a layout of an IC 60 according to an example embodiment of the disclosure. Particularly, the plan view of FIG. 6 shows a first HD column HD1, a first interface column IF1, and a first HP column HP1 in the IC 60. In the first HD column HD1, a plurality of HD cells may be aligned and placed in a plurality of rows R11 to R18, and in the first HP column HP1, a plurality of HP cells may be aligned and placed in a plurality of rows R21 to R26.

The IC 60 may include wells of a first conductivity type, and the wells of the first conductivity type may be formed on a substrate of a second conductivity type. For example, the IC 60 may be formed on a P-type substrate and may include an N well (or an N-type well) for forming a PFET. As shown in FIG. 6, the IC 60 may include a plurality of N wells NW11 to NW15 extending in the X-axis direction in the first HD column HD1, and may include a plurality of N wells NW21 to NW24 extending in the X-axis direction in the first HP column HP1. The N wells NW11 to NW15 of the first HD column HD1 and the N wells NW21 to NW24 of the first HP column HP1 may have the same potential (e.g., a positive supply voltage).

The first interface column IF1 may include an N well NWC connecting the N wells NW11 to NW15 of the first HD column HD1 to the N wells NW21 to NW24 of the first HP column HP1. For example, as shown in FIG. 6, the N wells NW11 to NW15 of the first HD column HD1 and the N wells NW21 to NW24 of the first HP column HP1 may further extend into the first interface column IF1 to connect with the N well NWC of the first interface column IF1, and the N well NWC of the first interface column IF1 may extend in the Y-axis direction and connect the N wells NW11 to NW15 of the first HD column HD1 to the N wells NW21 to NW24 of the first HP column HP1.

Figure 7:
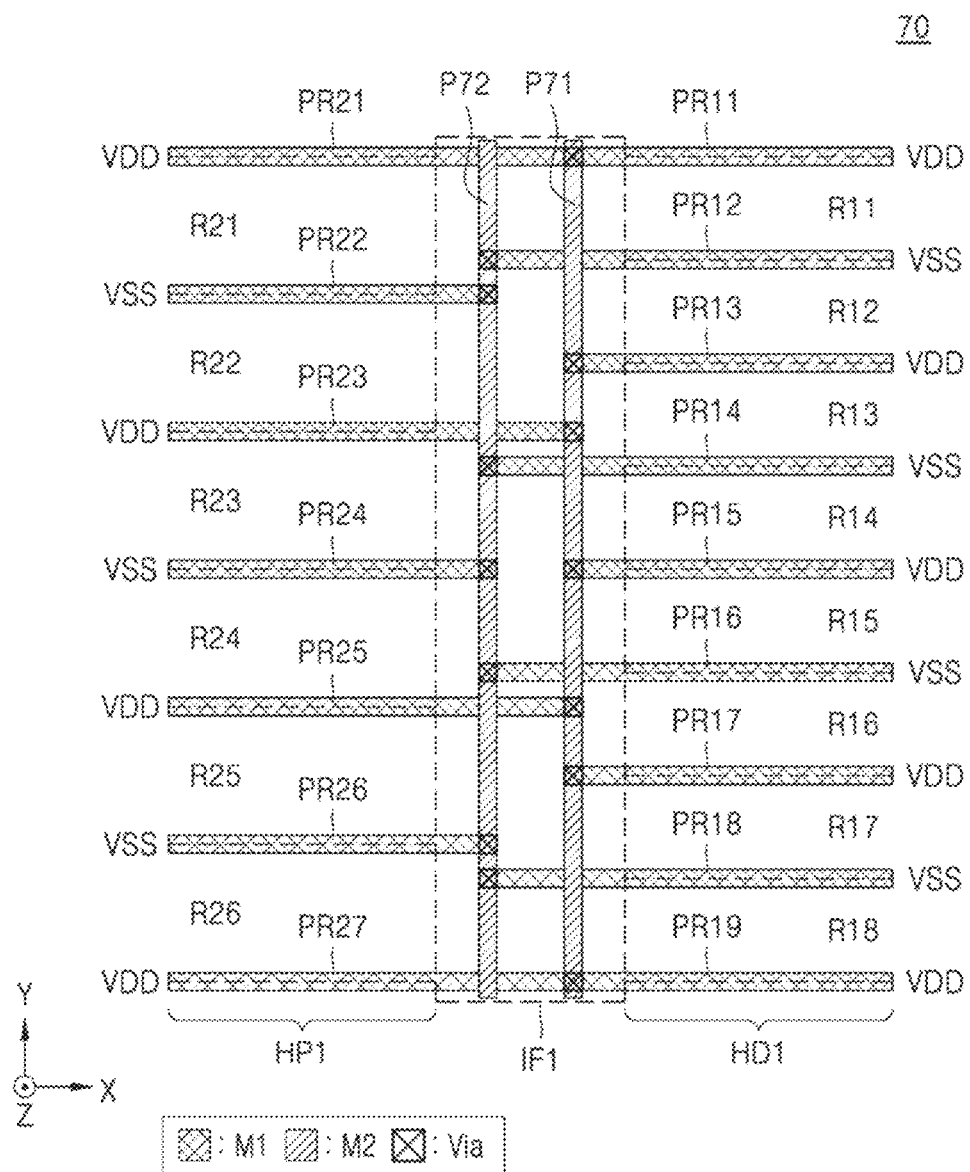
FIG. 7 is a plan view of a layout of an IC according to an embodiment.

FIG. 7 is a plan view of a layout of an IC 70 according to an example embodiment of the disclosure. Particularly, the plan view of FIG. 7 shows a first HD column HD1, a first interface column IF1, and a first HP column HP1 in the integrated circuit 70. In the first HD column HD1, a plurality of HD cells may be aligned and placed in a plurality of rows R11 to R18, and in the first HP column HP1, a plurality of HP cells may be aligned and placed in a plurality of rows R21 to R26.

The IC 70 may include power rails for providing a positive supply voltage VDD or a negative supply voltage (or a ground potential) VSS to a plurality of cells. For example, as shown in FIG. 7, in the first HD column HD1, power rails PR11, PR13, PR15, PR17, and PR19 for providing the positive supply voltage VDD to a plurality of HD cells may extend in the X-axis direction and power rails PR12, PR14, PR16, and PR18 for providing the negative supply voltage VSS to the plurality of HD cells may extend in the X-axis direction. Similarly, in the first HP column HP1, power rails PR21, PR23, PR25, and PR27 for providing the positive supply voltage VDD to a plurality of HP cells may extend in the X-axis direction and power rails PR22, PR24, and PR26 for providing the negative supply voltage VSS to the plurality of HP cells may extend in the X-axis direction. In some embodiments, a power rail may include a pattern extending in the X-axis direction in a wiring layer different from the first wiring layer M1, for example, a third wiring layer M3, and may include a via connecting patterns of different wiring layers. In addition, the power rail may include a buried pattern extending in the X-axis direction, which will be described later with reference to FIG. 9, and may include a source/drain contact and/or a gate contact extending in the X-axis direction. Hereinafter, for convenience of illustration, the power rail is shown as a pattern of the first wiring layer M1, but example embodiments of the disclosure are not limited thereto.

The first interface column IF1 may include a pattern connecting a power rail of the first HD column HD1 to a power rail of the first HP column HP1. For example, as shown in FIG. 7, the plurality of power rails PR11 to PR19 of the first HD column HD1 and the plurality of power rails PR21 to PR27 of the first HP column HP1 may further extend into the first interface column IF1 to connect with first and second patterns P71 and P72. The first interface column IF1 may include the first pattern P71, which is connected to the power rails PR11, PR13, PR15, PR17, PR19, PR21, PR23, PR25, and PR27 for providing the positive supply voltage VDD and extends in the Y-axis direction. Furthermore, the first interface column IF1 may include the second pattern P72, which is connected to the power rails PR12, PR14, PR16, PR18, PR22, R24, and P426 for providing the negative supply voltage VSS and extends in the Y-axis direction. As shown in FIG. 7, the first and second patterns P71 and P72 may be respectively connected to power rails through vias. Herein, like the first and second patterns P71 and P72, a pattern to which the positive supply voltage VDD or the negative supply voltage VSS is applied, the pattern extending in the Y-axis direction in the first interface column IF1 may be referred to as a power line.

A pattern extending in the Y-axis direction while connecting power rails in the first interface column IF1 may be formed in various layers. For example, the first interface column IF1 may include patterns extending in the Y-axis direction in a second wiring layer M2 above the first wiring layer M1, such as the first and second patterns P71 and P72 of FIG. 7. In addition, in some embodiments, the first interface column IF1 may include buried patterns, gate electrodes, and/or source/drain contacts extending in the Y-axis direction. Hereinafter, for convenience of illustration, the first interface column IF1 is illustrated to include a pattern extending in the Y-axis direction in the second wiring layer M2, but example embodiments of the disclosure are not limited thereto.

In some embodiments, the first interface column IF1 may include power lines formed in different layers. For example, in the first interface column IF1, a power line to which the positive supply voltage VDD is applied may be formed in the second wiring layer M2, while a power line to which the negative supply voltage VSS is applied may include a gate electrode and/or a source/drain contact. In addition, in some embodiments, the power lines formed in the different layers described above may overlap each other in a Z-axis direction, and as a result, the width of the first interface column IF1, that is, the length thereof in the X-axis direction, may be shortened.

Figure 8A:
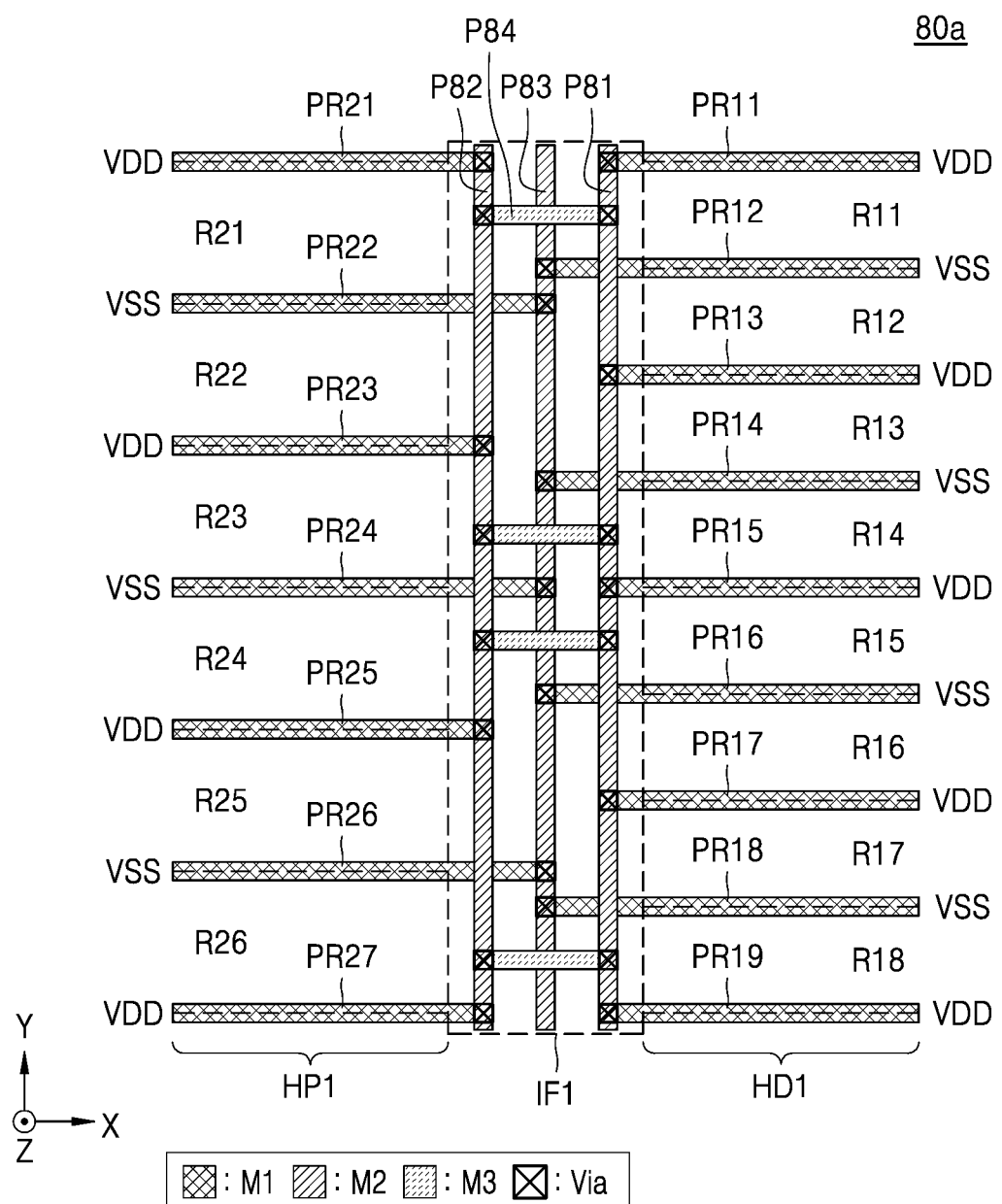
FIGS. 8A and 8B are plan views of layouts of ICs according to embodiments.
Figure 8B:
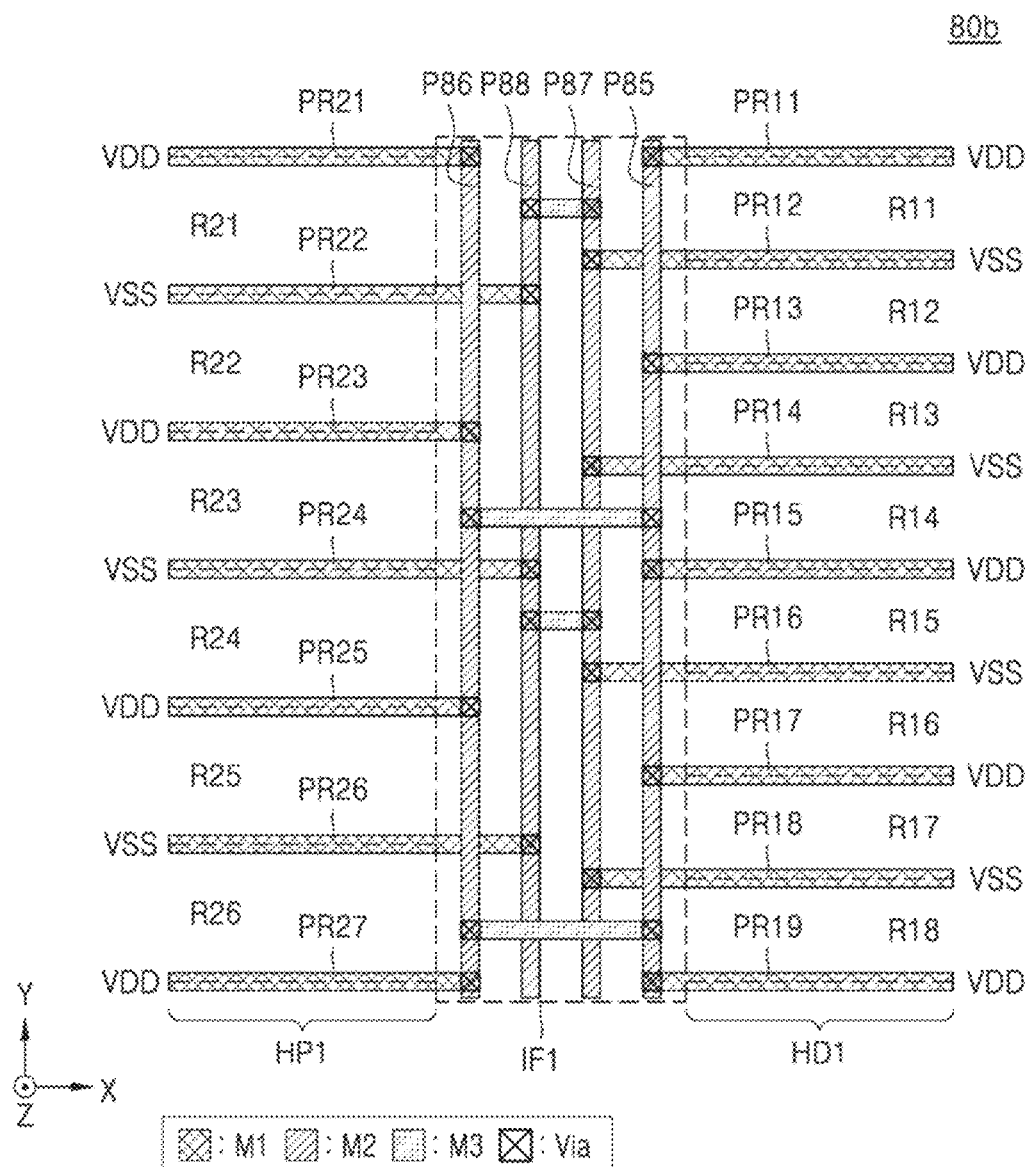

FIGS. 8A and 8B are plan views of layouts of ICs according to example embodiments of the disclosure. Particularly, the plan views of FIGS. 8A and 8B show a first HD column HD1, a first interface column IF1, and a first HP column HP1 in ICs 80a and 80b, respectively. In the first HD column HD1, a plurality of HD cells may be aligned and placed in a plurality of rows R11 to R18, and in the first HP column HP1, a plurality of HP cells may be aligned and placed in a plurality of rows R21 to R26. Compared with the IC 70 of FIG. 7, the first interface column IF1 in the ICs 80a and 80b of FIGS. 8A and 8B may include a pair of patterns, which are connected to power rails for providing the same supply voltage (e.g., a positive supply voltage VDD) and extend in the Y-axis direction. Regarding the descriptions of FIGS. 8A and 8B, descriptions that are the same as those with respect to FIG. 7 will be omitted.

Referring to FIG. 8A, the first interface column IF1 may include a first pattern P81, which is connected to power rails PR11, PR13, PR15, PR17, and PR19 for providing a positive supply voltage VDD and extends in the Y-axis direction. In addition, the first interface column IF1 may include a second pattern P82, which is connected to power rails PR21, PR23, PR25, and PR27 for providing the positive supply voltage VDD and extends in the Y-axis direction. Furthermore, the first interface column IF1 may include a third pattern P83, which is connected to power rails PR12, PR14, PR16, PR18, PR22, PR24, and PR26 for providing a negative supply voltage VSS and extends in the Y-axis direction. As shown in FIG. 8A, the first, second, and third patterns P81, P82, and P83 may be respectively connected to the power rails through vias.

The first interface column IF1 may include at least one pattern extending in the X-axis direction that connects patterns extending in the Y-axis direction. For example, as shown in FIG. 8A, the first interface column IF1 may include a fourth pattern P84 that connects the first and second patterns P81 and P82 and extends in the X-axis direction. Furthermore, the first pattern P81 may be formed close to the first HD column HD1, and the second pattern P82 may be formed close to the first HP column HP1. Accordingly, the power rails PR11, PR13, PR15, PR17, and PR19 may extend to the first pattern P81, and the power rails PR21, PR23, PR25, and PR27 may extend to the second pattern P82. As a result, in the first interface column IF1, the congestion of routing for connecting power rails may be reduced and design rules may be more easily satisfied.

In order to connect patterns extending in the Y-axis direction in the first interface column IF1, a pattern extending in the X-axis direction may be formed in various layers. For example, the first interface column IF1 may include a pattern extending in the X-axis direction in a third wiring layer M3 above a second wiring layer M2, such as a fourth pattern P84 of FIG. 8A. In addition, in some embodiments, the first interface column IF1 may include a pattern extending in the X-axis direction in a wiring layer different from the third wiring layer M3, for example, the first wiring layer M1, and may include buried patterns, source/drain contacts, and/or through silicon vias extending in the X-axis direction. Hereinafter, for convenience of illustration, the first interface column IF1 is illustrated to include a pattern extending in the X-axis direction in the third wiring layer M3, but example embodiments of the disclosure are not limited thereto.

Referring to FIG. 8B, the first interface column IF1 may include a fifth pattern P85, which is connected to power rails PR11, PR13, PR15, PR17, and PR19 for providing a positive supply voltage VDD and extends in the Y-axis direction. In addition, the first interface column IF1 may include a sixth pattern P86, which is connected to power rails PR21, PR23, PR25, and PR27 for providing the positive supply voltage VDD and extends in the Y-axis direction. Furthermore, the first interface column IF1 may include a seventh pattern P87, which is connected to power rails PR12, PR14, PR16, and PR18 for providing a negative supply voltage VSS and extends in the Y-axis direction. In addition, the first interface column IF1 may include an eighth pattern P88, which is connected to power rails PR22, PR24, and PR26 for providing the negative supply voltage VSS and extends in the Y-axis direction. As shown in FIG. 8B, the fifth to eighth patterns P85 to P88 may be respectively connected to power rails through vias.

As shown in FIG. 8B, in the first interface column IF1, the seventh and eighth patterns P87 and P88 to which the negative supply voltage VSS is applied may be formed between the fifth pattern P85 and the sixth pattern P86, to which the positive supply voltage VDD is applied. In some embodiments, unlike in FIG. 8B, the fifth and sixth patterns P85 and P86 to which the positive supply voltage VDD is applied may be formed between the seventh pattern P87 and the eighth pattern P88, to which the negative supply voltage VSS is applied. In addition, the first interface column IF1 may include patterns connecting the fifth and sixth patterns P85 and P86 and extending in the X-axis direction, and patterns connecting the seventh and eighth patterns P87 and P88 and extending in the X-axis direction.

Compared with the first interface column IF1 of FIG. 7, the first interface column IF1 of FIGS. 8A and 8B may include an additional pattern extending in the Y-axis direction, and thus, power rails may be more simply connected. For example, in the first interface column IF1 of FIGS. 8A and 8B, a structure such as two power rails PR14 and PR23 adjacent to each other in FIG. 7 may be omitted.

Figure 9:
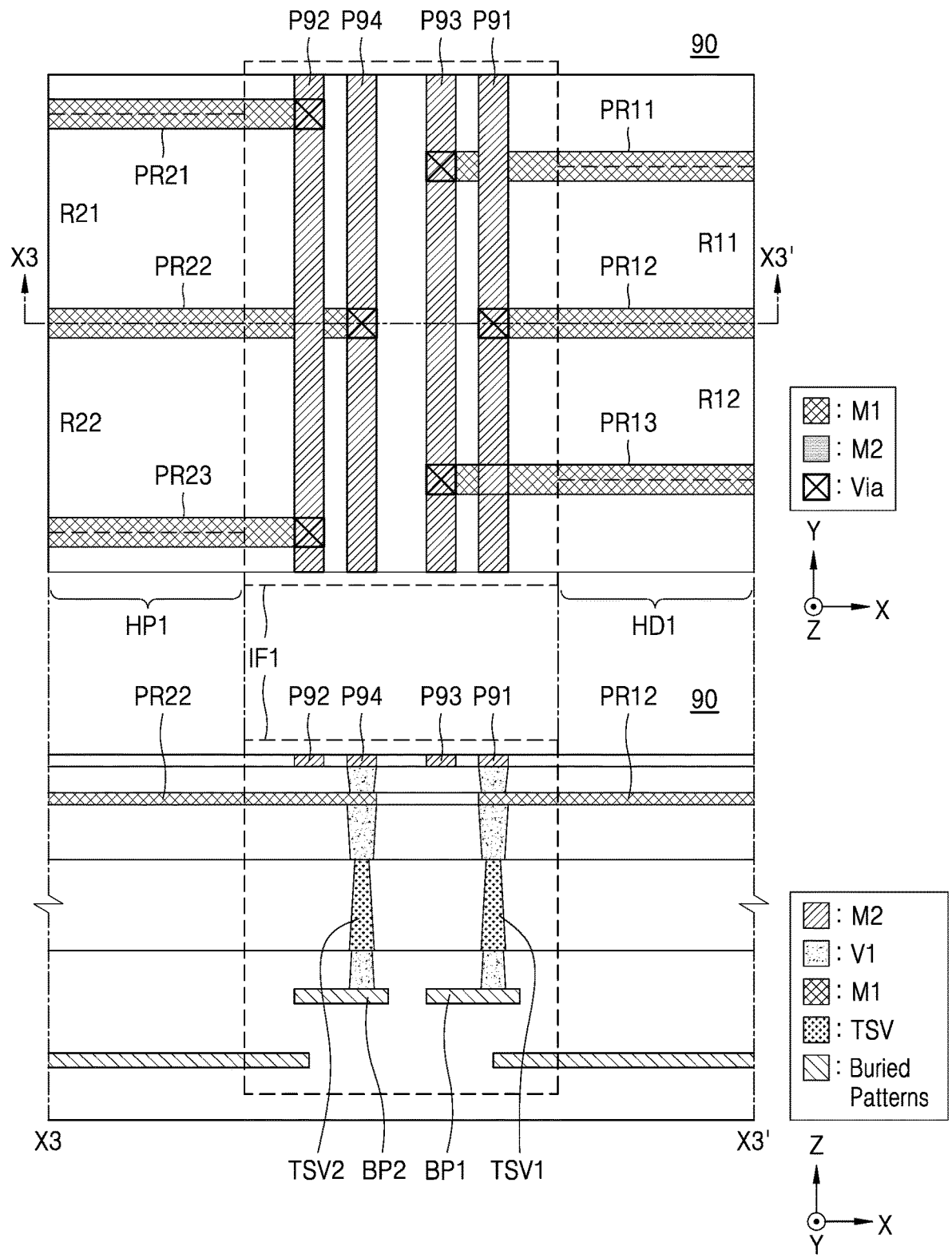
FIG. 9 is a view of a layout of an IC according to an embodiment.

FIG. 9 is a view of a layout of an IC 90 according to an example embodiment of the disclosure. Particularly, an upper part of FIG. 9 shows a plan view of the IC 90, and a lower part of FIG. 9 shows a cross-sectional view of the IC 90 taken along line X3-X3' in the plan view. A plurality of HD cells may be aligned and placed in a plurality of rows R11 and R12 in a first HD column HD1, and a plurality of HP cells may be aligned and placed in a plurality of rows R21 and R22 in a first HP column HP1.

Referring to the upper part of FIG. 9, a plurality of power rails PR11 to PR13 may extend in the X-axis direction in the first HD column HD1, and a plurality of power rails PR21 to PR23 may extend in the X-axis direction in the first HP column HP1. In the first interface column IF1, first to fourth patterns P91 to P94 may extend in the Y-axis direction, and each of the first to fourth patterns P91 to P94 may be connected, through a via, to at least one of the plurality of power rails PR11 to PR13 of the first HD column HD1 and the plurality of power rails PR21 to PR23 of the first HP column HP1.

In the first interface column IF1, a pattern extending in the Y-axis direction may be connected to a buried pattern through a through silicon via (TSV). A buried pattern may refer to a pattern formed under a substrate 10, and a power rail including the buried pattern may be referred to as a buried power rail. As shown in FIG. 9, the first pattern P91 may be connected to a first buried pattern BP1 through vias, a power rail PR12, and a first TSV TSV1. Also, the fourth pattern P94 may be connected to a second buried pattern BP2 through vias, a power rail PR22, and a second TSV TSV2.

Figure 10:
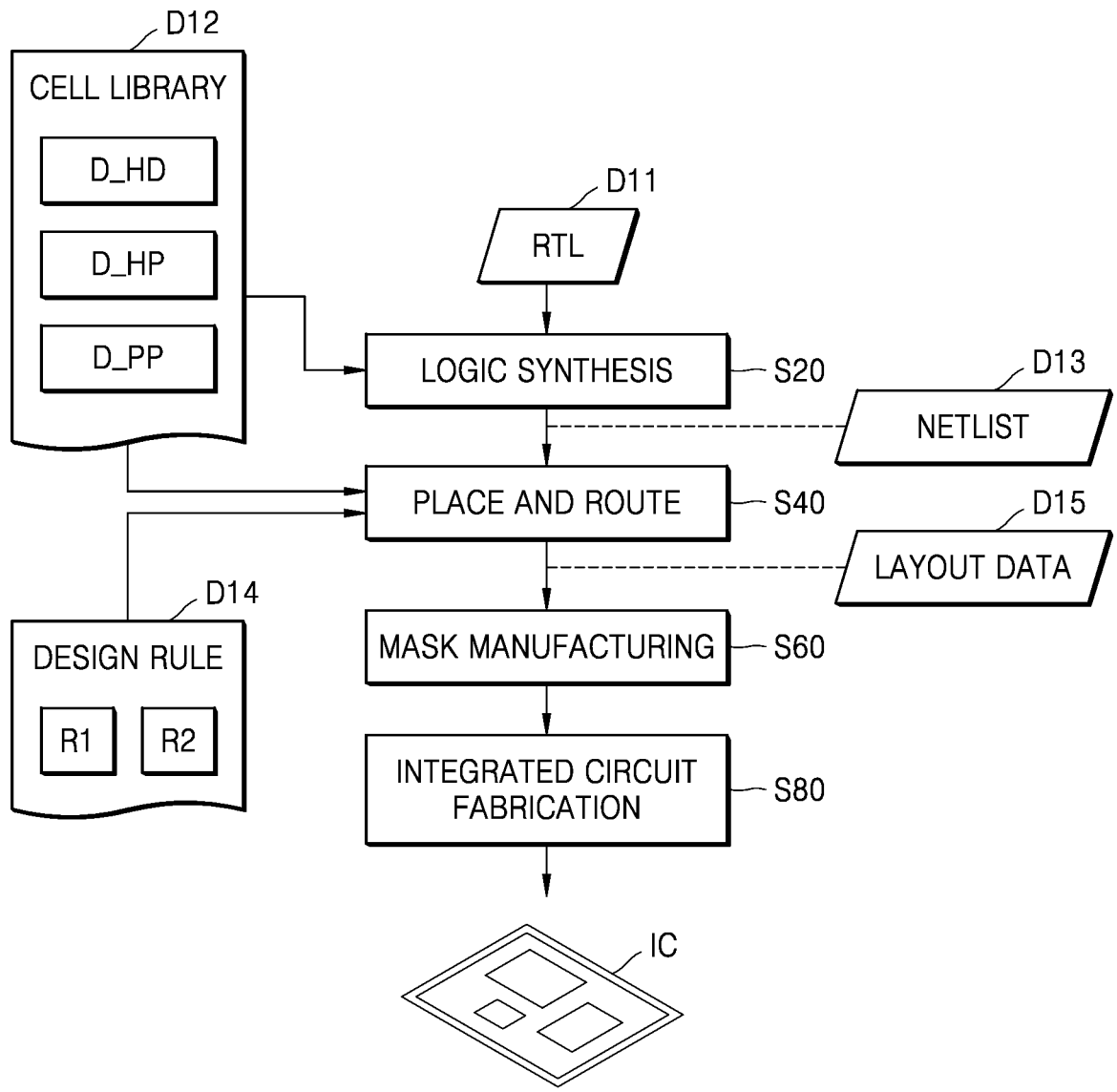
FIG. 10 is a flowchart of a method of fabricating an IC, according to an embodiment.

FIG. 10 is a flowchart of a method of fabricating an IC, according to an example embodiment of the disclosure. Particularly, the flowchart of FIG. 10 shows an example of a method of fabricating an IC including a mixed-column block. As shown in FIG. 10, the method of fabricating an IC may include a plurality of operations S20, S40, S60, and S80.

A cell library (or standard cell library) D12 may include information about cells, e.g., function information, characteristic information, and layout information. As shown in FIG. 10, the cell library D12 may include first data D_HD defining HD cells, second data D_HP defining HP cells, and third data D_PP defining pre-placement cells. For example, the first data D_HD may define HD cells with the first height H1 or a height corresponding to a multiple of the first height H1, and the second data D_HP may define HP cells with the second height H2 or a height corresponding to a multiple of the second height H2. In addition, the third data D_PP may define pre-placement cells that are placed before the HD cells and the HP cells are placed. In some embodiments, the pre-placement cells may include non-functional cells that do not perform logical operations. For example, the pre-placement cells may include a well tap, a substrate tap, a filler, a decap cell, a power switch cell, and the like.

In operation S20, a logic synthesis operation of generating a netlist D13 from register transfer level (RTL) data D11 may be performed. For example, a semiconductor design tool (e.g., a logic synthesis tool) may generate the netlist D13 including a bitstream or a netlist by performing logic synthesis on the RTL data D11 with reference to the cell library D12, the RTL data D11 being created by a hardware description language (HDL) such as a very high-speed integrated circuit (VHSIC) hardware description language (VHDL) or Verilog. The semiconductor design tool may select an HD cell or an HP cell from the cell library D12 based on requirements of an IC. For example, the semiconductor design tool may select an HD cell between the HD cell and an HP cell providing the same function when timing of a signal path has a margin.

In operation S40, a place and route (P&R) operation of generating layout data D15 from the netlist D13 may be performed. For example, a semiconductor design tool (e.g., a P&R tool) may define HD columns in which HD cells are to be placed and HP columns in which HP cells are to be placed, for a floorplan of an IC. After placing pre-placement cells by referring to the cell library D12, the semiconductor design tool may place HD cells in the HD columns and HP cells in the HP columns based on the netlist D13. The semiconductor design tool may generate interconnections electrically connecting output pins and input pins of the placed cells, and generate layout data D15 defining the placed cells and the generated interconnections. The layout data D15 may have a format, for example, graphic design system II (GDSII) and include geometric information of cells and interconnections.

The semiconductor design tool may refer to a design rule D14 while placing and routing cells. The design rule D14 may include requirements that the layout of the IC has to comply with. For example, the design rule D14 may include requirements for a space between patterns, a minimum width of a pattern, a routing direction of a wiring layer, and the like. As shown in FIG. 10, the design rule D14 may include a first rule group R1 and a second rule group R2 including more relaxed requirements than the first rule group R1. In some embodiments, an interface column may include a pre-placement cell, and thus the semiconductor design tool may refer to the first rule group R1 while performing placement and routing on interface cells between HD cells and HP cells. Operation S40 alone or both operations S20 and S40 may be referred to as a method of designing an IC, and an example of operation S40 will be described below with reference to FIG. 11.

In operation S60, an operation of manufacturing a mask may be performed. For example, optical proximity correction (OPC) for correcting a distortion phenomenon such as refraction caused by characteristics of light in photolithography may be applied to the layout data D15. Patterns on a mask may be defined to form patterns in a plurality of layers based on data to which OPC is applied, and at least one mask (or photomask) for forming the respective patterns of the plurality of layers may be manufactured. In some embodiments, a layout of an IC may be restrictively modified in operation S60, and the restrictively modifying of the IC in operation S60 is post-processing for optimizing a structure of the IC and may be referred to as design polishing.

In operation S80, an operation of fabricating an IC may be performed. For example, the IC may be fabricated by using the at least one mask, manufactured in operation S60, to pattern a plurality of layers. A front-end-of-line (FEOL) process may include planarizing and cleaning a wafer, forming a trench, forming a well, forming a gate electrode, and forming a source and a drain, and individual devices, e.g., transistors, capacitors, and resistors may be formed on a substrate by the FEOL process. In addition, a back-end-of-line (BEOL) process may include siliciding gate, source, and drain regions, adding a dielectric, performing planarization, forming a hole, adding a metal layer, forming a via, forming a passivation layer, and the like, and individual devices, e.g., transistors, capacitors, and resistors, may be interconnected by the BEOL process. In some embodiments, a middle-of line (MOL) process may be performed between the FEOL process and the BEOL process, and contacts may be formed on individual devices. Thereafter, the IC may be packaged in a semiconductor package and used as a component of various applications.

Figure 11:
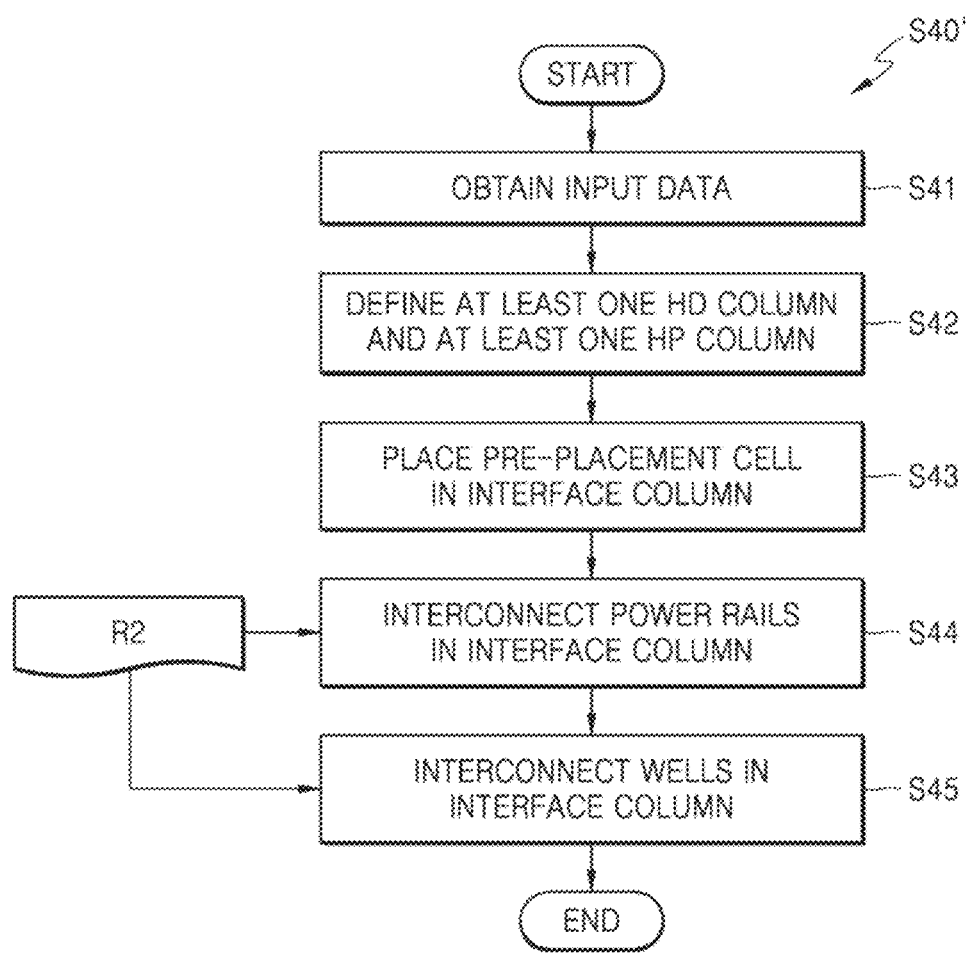
FIG. 11 is a flowchart of a method of designing an IC, according to an embodiment.

FIG. 11 is a flowchart of a method of designing an IC, according to an example embodiment of the disclosure. Particularly, the flowchart of FIG. 11 is an example of operation S40 of FIG. 10. As described above with reference to FIG. 10, in operation S40' of FIG. 11, P&R may be performed. As shown in FIG. 11, operation S40' may include a plurality of operations S41 to S45, and hereinafter, FIG. 11 will be described with reference to FIG. 10.

Referring to FIG. 11, in operation S41, input data may be obtained. The input data may include information about HD cells and HP cells and may be, for example, the netlist D13 of FIG. 10. The netlist D13 may define HD cells and HP cells actually included in an IC from among the HD cells and HP cells defined by the cell library D12, and accordingly, HD columns and HP columns may depend on the netlist D13.

In operation S42, at least one HD column and at least one HP column may be defined. For example, the semiconductor design tool may define the position, size (i.e., a length in the X-axis direction), placement, etc. of each of at least one HD column and at least one HP column for the placement of HD cells and HP cells defined by the netlist D13. Accordingly, an interface column may be defined between a defined HD column and a defined HP column. In subsequent operations S43, S44, and S45, the structure of the interface column may be created. In some embodiments, at least two of operations S43, S44, and S45 may be performed in parallel.

In operation S43, pre-placement cells may be placed in the interface column. For example, the semiconductor design tool may place pre-placement cells in the interface column defined in operation S42, and thus, the interface column may be a separate space saved for the pre-placement cells. In some embodiments, the semiconductor design tool may refer to input data, that is, the netlist D13, when pre-placement cells are placed. For example, as one of the pre-placement cells, a power switch cell may block a positive supply voltage VDD or a negative supply voltage VSS, which is supplied to adjacent HD cells and HP cells, according to a control signal indicating a low power mode. The netlist D13 may define HD cells and HP cells supporting a low power mode, and the semiconductor design tool may place the power switch cell in an interface column close to the HD cells and HP cells. In addition, as examples of pre-placement cells placed in the interface column, a well tap and a substrate tap will be described later with reference to FIG. 12.

In operation S44, power rails may be interconnected in the interface column. For example, the semiconductor design tool may generate at least one pattern extending in the Y-axis direction in the interface column, and may generate vias for connecting the at least one pattern to the power rails. As described above with reference to FIG. 7, two patterns extending in the Y-axis direction may be generated, and as described above with reference to FIG. 8A, three patterns extending in the Y-axis direction may be generated. As described above with reference to FIG. 8B, four patterns extending in the Y-axis direction may be generated. Furthermore, an example of a larger number of patterns extending in the Y-axis direction in the interface column will be described later with reference to FIG. 12.

In operation S45, wells may be interconnected in the interface column. For example, as described above with reference to FIG. 6, the semiconductor design tool may generate a well extending in the Y-axis direction, the well in the interface column connecting wells extending in the X-axis direction in the HD column and the HP column.

As shown in FIG. 11, in operations S44 and S45, the second rule group R2 of the design rule D14 may be referred to. As described above with reference to FIG. 10, the second rule group R2 may include more relaxed requirements than the first rule group R1 of the design rule D14, and accordingly, in the interface column, the interconnection of power rails and the interconnection of wells may be based on the more relaxed requirements. For example, a space between patterns having the same potential in the second rule group R2 may be reduced or eliminated, and requirements for a jog of a well and/or a termination of a fin may be relaxed or eliminated. As described above with reference to the drawings, unlike in the HP column and HD column in which HP cells and HD cells that perform logical operations are placed, the interconnection of power rails and the interconnection of wells, in the interface column, may occur at locations spaced from the HP cells and HD cells performing logical operations. Accordingly, even though the interconnection of power rails and the interconnection of wells is based on the more relaxed requirements, an impact on the HD cells and HP cells may be limited. Accordingly, due to the second rule group R2 including more relaxed requirements, the interface column may be designed with a high degree of freedom.

Figure 12:
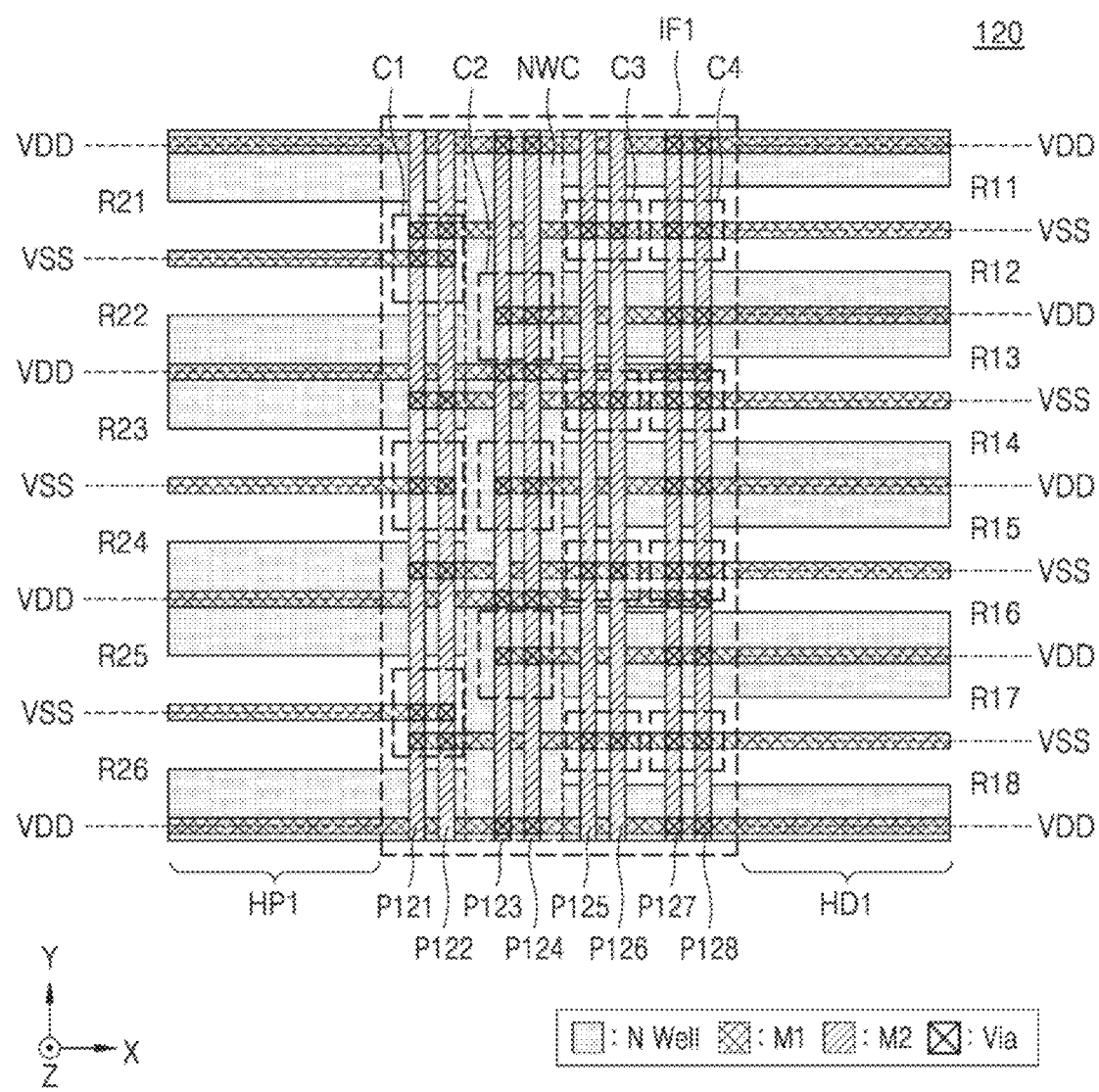
FIG. 12 is a plan view of a layout of an IC according to an embodiment.

FIG. 12 is a plan view of a layout of an IC 120 according to an example embodiment of the disclosure. Particularly, the plan view of FIG. 12 shows a first HD column HD1, a first interface column IF1, and a first HP column HP1 in the IC 120. In the first HD column HD1, a plurality of HD cells may be aligned and placed in a plurality of rows R11 to R18, and in the first HP column HP1, a plurality of HP cells may be aligned and placed in a plurality of rows R21 to R26.

The first interface column IF1 may include first to eighth patterns P121 to P128 extending in the Y-axis direction to connect power rails. That is, the first interface column IF1 may include the third, fourth, seventh, and eighth patterns P123, P124, P127, and P128 as two pairs of patterns to which the positive supply voltage VDD is applied, and may include the first, second, fifth, and sixth patterns P121, P122, P125, and P126 as two pairs of patterns to which the negative supply voltage VSS is applied.

The IC 120 may include at least one well tap and/or a substrate tap placed in the first interface column IF1. The well tap may provide a voltage supplied from the outside to a well in order to bias the well. For example, an N-well tap may include an N+-doped region to which the positive supply voltage VDD is applied, the N+-doped region being in contact with an N well. In addition, the substrate tap may provide a voltage supplied from the outside to a substrate to bias the substrate. For example, a substrate tap for a P-type substrate may include a P+-doped region to which the negative supply voltage VSS is applied, the P+-doped region being in contact with a substrate.

Referring to FIG. 12, the first interface column IF1 may include an N well NWC extending in the Y-axis direction to connect N wells of the first HD column HD1 and N wells of the first HP column HP1, and may include an N well tap C2 formed on the N well NWC. In addition, the first interface column IF1 may include substrate taps C1, C3, and C4 formed between N wells and extending in the X-axis direction. As shown in FIG. 12, the substrate taps C1, C3 and C4 may be placed on the left and right sides of the N well NWC, and accordingly, the N well tap may be placed between the substrate taps C1, C3 and C4.

In some embodiments, a well tap and a substrate tap may each be placed at a point where a pattern extending in the Y-axis direction in the first interface column IF1 intersects a power rail extending in the X-axis direction. For example, as shown in FIG. 12, the N-well tap C2 may be placed at a point where a power rail extending over the boundary between two rows R12 and R13 of the first HD column HD1 intersects the third and fourth patterns P123 and P124. In addition, as shown in FIG. 12, the substrate tap C1 may be placed at a point where a power rail extending over the boundary between two rows R21 and R22 of the first HP column HP1 intersects the first and second patterns P121 and P122.

Figure 13:
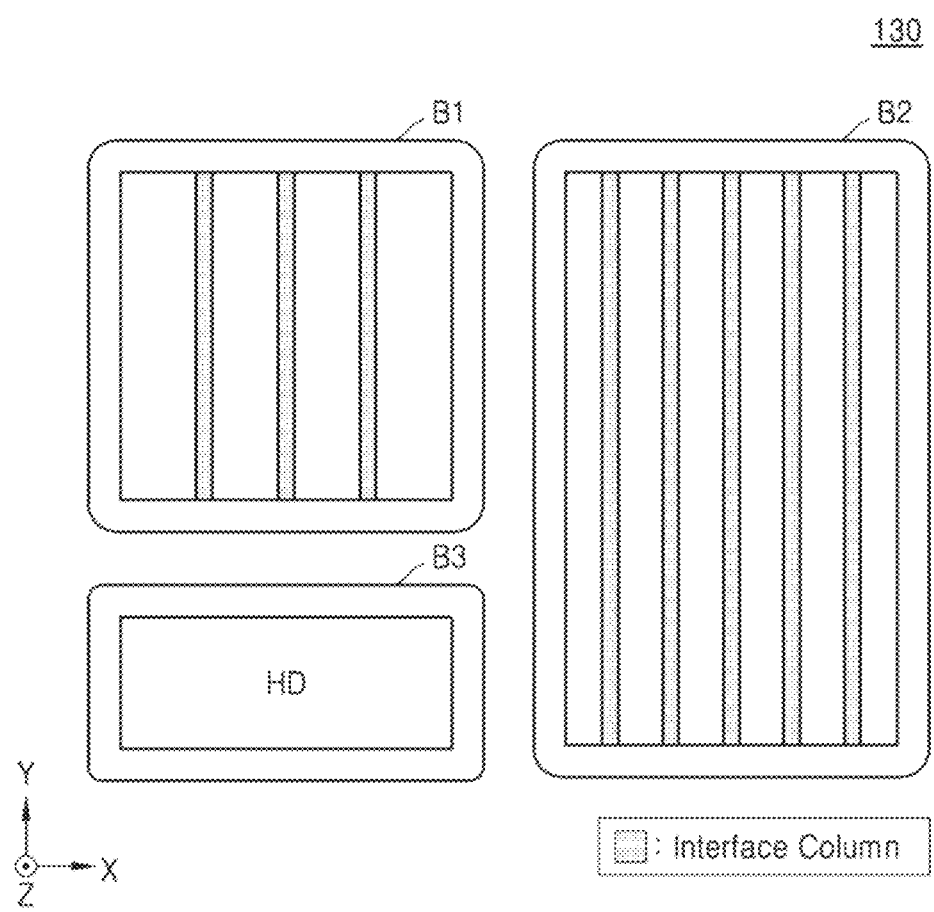
FIG. 13 is a plan view of a layout of an IC according to an embodiment.

FIG. 13 is a plan view of a layout of an IC 130 according to an example embodiment of the disclosure. Particularly, the plan view of FIG. 13 schematically shows a layout of an IC 130 including a plurality of blocks.

Referring to FIG. 13, the IC 130 may include first to third blocks B1 to B3. A block may indicate a unit of layout independently designed and formed. For example, the IC 130 may perform various functions, and each of the first to third blocks B1 to B3 may be designed to perform at least one of the various functions. In some embodiments, each of the first to third blocks B1 to B3 may be formed from an independent netlist, and dynamic voltage frequency scaling (DVFS) may be independently applied thereto.

The first to third blocks B1 to B3 may have different column configurations as shown in FIG. 13. For example, the first to third blocks B1 to B3 may be designed by referring to a common cell library defining a plurality of HD cells and a plurality of HP cells, but an HD column in which the HD cells are placed and an HP column in which the HP cells are placed may be differently defined in each of the first to third blocks B1 to B3. As shown in FIG. 13, the first and second blocks B1 and B2 may be mixed-column blocks, and the third block B3 may be an HD block. In the first and second blocks B1 and B2, interface columns described above with reference to the drawings may be placed between HP columns and HD columns. Accordingly, the IC 130 may provide an optimized area and performance.

Figure 14:
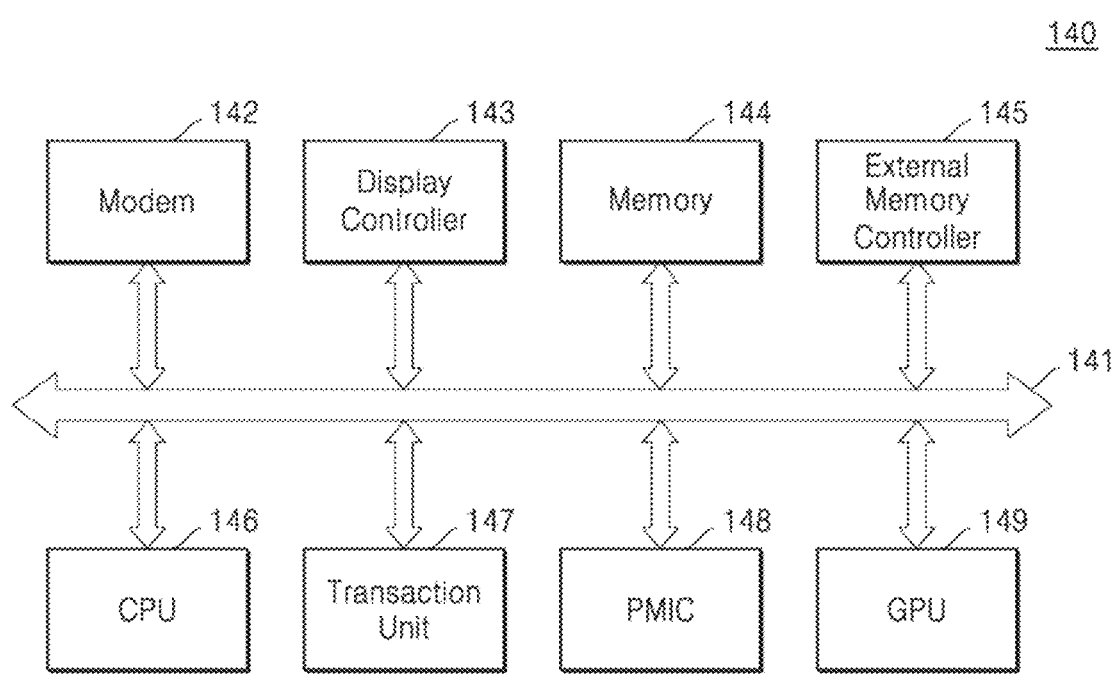
FIG. 14 is a block diagram of a system on chip (SoC) according to an embodiment.

FIG. 14 is a block diagram of a system on chip (SoC) 140 according to an example embodiment of the disclosure. The SoC 140 is a semiconductor device and may include an IC according to an example embodiment of the disclosure. The SoC 140 is obtained by implementing, in a single chip, complicated functional blocks, such as intellectual property (IP) blocks performing various functions, and the SoC 140 may be designed by the method of designing an IC, according to example embodiments of the disclosure, and accordingly, the SoC 140 for providing an optimized area and performance may be achieved. Referring to FIG. 14, the SoC 140 may include a modem 142, a display controller 143, a memory 144, an external memory controller 145, a central processing unit (CPU) 146, a transaction unit 147, a power management integrated circuit (PMIC) 148, and a graphics processing unit (GPU) 149, and the functional blocks of the SoC 140 may communicate with each other via a system bus 141.

The CPU 146 capable of generally controlling an operation of the SoC 140 in the top level may control operations of the other functional blocks, that is, the modem 142, the display controller 143, the memory 144, the external memory controller 145, the transaction unit 147, the PMIC 148, and the GPU 149. The modem 142 may demodulate a signal received from the outside of the SoC 140, or modulate a signal generated inside the SoC 140 and transmit the modulated signal to the outside. The external memory controller 145 may control an operation of transmitting and receiving data to and from an external memory device connected to the SoC 140. For example, a program and/or data stored in the external memory device may be provided to the CPU 146 or the GPU 149 under control of the external memory controller 145. The GPU 149 may execute program instructions associated with graphics processing. The GPU 149 may receive graphic data through the external memory controller 145 and transmit graphic data processed by the GPU 149 to the outside of the SoC 140 through the external memory controller 145. The transaction unit 147 may monitor a data transaction of each functional block, and the PMIC 148 may control power to be supplied to each functional block, under control of the transaction unit 147. The display controller 143 may transmit data generated inside the SoC 140 to a display (or a display device) outside the SoC 140 by controlling the display. The memory 144 may include a nonvolatile memory such as electrically erasable programmable read-only memory (EEPROM) or flash memory or a volatile memory such as dynamic random access memory (DRAM) or static random access memory (SRAM).

Figure 15:
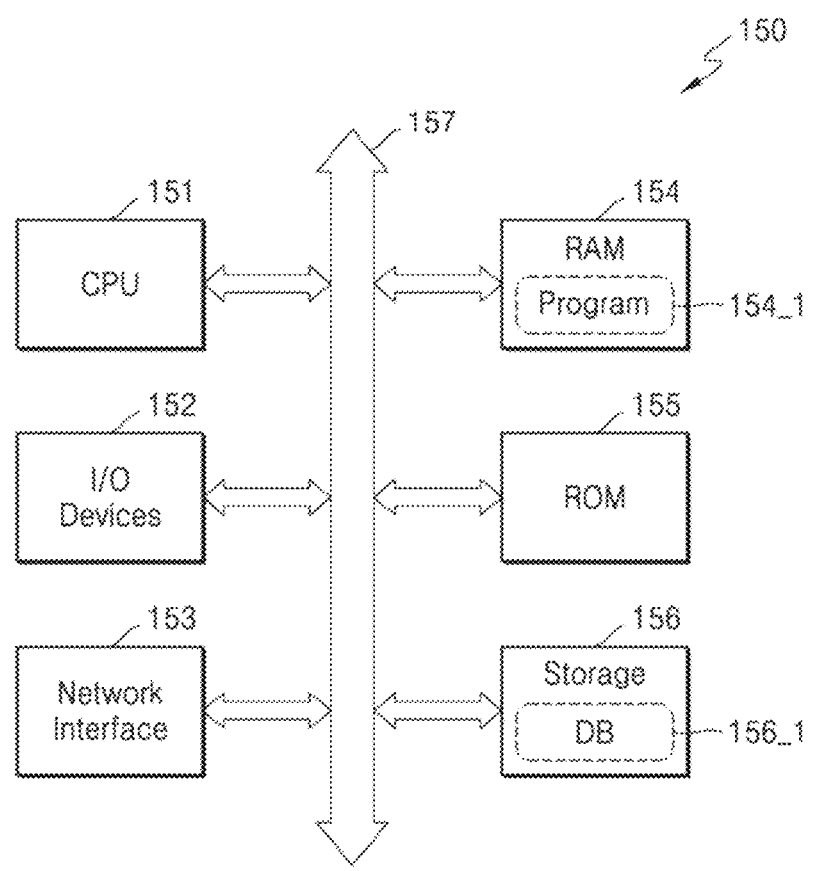
FIG. 15 is a block diagram of a computing system including a memory storing a program, according to an embodiment.

FIG. 15 is a block diagram of a computing system 150 including a memory storing a program, according to an example embodiment of the disclosure. At least some of operations included in a method of designing an IC, in some embodiments, e.g., the method of FIG. 10 and/or the method of FIG. 11, may be performed by the computing system 150 (or computer).

The computing system 150 may be a stationary computing system such as a desktop computer, a workstation, or a server or a portable computing system such as a laptop computer. As shown in FIG. 15, the computing system 150 may include a processor 151, input/output devices 152, a network interface 153, random access memory (RAM) 154, read only memory (ROM) 155, and a storage 156. The processor 151, the input/output devices 152, the network interface 153, the RAM 154, the ROM 155, and the storage 156 may be connected to a bus 157 and communicate with each other via the bus 157.

The processor 151 may be referred to as a processing unit and include at least one core, e.g., a micro-processor, an application processor (AP), a digital signal processor (DSP), and a GPU, capable of executing an arbitrary instruction set (e.g., Intel Architecture-32 (IA-32), 64-bit extended IA-32, x86-64, PowerPC, Sparc, million instructions per second (MIPS), advanced RISC (reduced instruction set computer) machine (ARM), or IA-64). For example, the processor 151 may access a memory, i.e., the RAM 154 or the ROM 155, via the bus 157 and execute instructions stored in the RAM 154 or the ROM 155.

The RAM 154 may store a program 154_1 for a method of designing an IC, according to an example embodiment of the disclosure, or at least a portion of the program 154_1, and the program 154_1 may allow the processor 151 to perform at least some of operations included in the method of designing an IC, e.g., the method of FIG. 10 and/or the method of FIG. 11. For example, the program 154_1 may include a plurality of instructions executable by the processor 151, and the plurality of instructions included in the program 154_1 may allow the processor 151 to perform at least some of the operations included in, for example, the flowchart of FIG. 11.

The storage 156 may not lose stored data even when power supplied to the computing system 150 is cut off. For example, the storage 156 may include a nonvolatile memory device or a storage medium such as magnetic tape, an optical disc, or a magnetic disc. In addition, the storage 156 may be detachable from the computing system 150. The storage 156 may store the program 154_1 according to an example embodiment of the disclosure, and the program 154_1 or at least a portion of the program 154_1 may be loaded from the storage 156 to the RAM 154 before the program 154_1 is executed by the processor 151. Alternatively, the storage 156 may store a file created by a program language, and the program 154_1 generated from the file by a compiler or the like or at least a portion of the program 154_1 may be loaded to the RAM 154. In addition, as shown in FIG. 15, the storage 156 may include a database (DB) 156_1, and the database 156_1 may contain information required to design an IC, e.g., the cell library D12 and/or the design rules D14 of FIG. 10.

The storage 156 may store data to be processed by the processor 151 or data processed by the processor 151. That is, the processor 151 may generate data by processing data stored in the storage 156 and store the generated data in the storage 156, according to the program 154_1. For example, the storage 156 may store the RTL data D11, the netlist D13, and/or the layout data D15 of FIG. 10 and store the input data of FIG. 11.

The input/output devices 152 may include input devices such as a keyboard and a pointing device and include output devices such as a display device and a printer. For example, through the input/output devices 152, a user may trigger execution of the program 154_1 by the processor 151, input the RTL data D11 and/or the netlist D13 of FIG. 10 and the input data of FIG. 11, and/or check the layout data D15 of FIG. 10.

The network interface 153 may provide access to a network outside the computing system 150. For example, the network may include a plurality of computing systems and communication links, and the communication links may include wired links, optical links, radio links, or other arbitrary-types of links.

While the disclosure has been particularly shown and described with reference to embodiments thereof, it will be understood that various changes in form and details may be made therein without departing from the spirit and scope of the following claims.

What is claimed is:

1. An integrated circuit (IC) comprising:
a first column in which a plurality of first cells are aligned and placed in a plurality of first rows, each first row of the plurality of first rows having a first width and extending in a first horizontal direction, the first column comprising a plurality of first gate electrodes extending, at a first pitch, in a second horizontal direction perpendicular to the first horizontal direction;
a second column in which a plurality of second cells are aligned and placed in a plurality of second rows, each second row of the plurality of second rows having a second width and extending in the first horizontal direction, the second column comprising a plurality of second gate electrodes extending in the second horizontal direction at a second pitch; and
an interface column extending in the second horizontal direction between the first column and the second column, the interface column comprising at least one interface gate electrode extending in the second horizontal direction, wherein the at least one interface gate electrode comprises at least one of:
a first interface gate electrode spaced apart from an outer one of the plurality of first gate electrodes by the first pitch; and
a second interface gate electrode spaced apart from an outer one of the plurality of second gate electrodes by the second pitch.

2. The IC of claim 1, wherein the at least one interface gate electrode comprises the first interface gate electrode, and
wherein the first interface gate electrode is spaced apart from the outer one of the plurality of second gate electrodes by the second pitch.

3. The IC of claim 1, wherein the at least one interface gate electrode comprises the first interface gate electrode and the second interface gate electrode.

4. The IC of claim 3, wherein the first interface gate electrode and the second interface gate electrode extend in the second horizontal direction and are separated by the first pitch or the second pitch.

5. The IC of claim 1, wherein the first column comprises a plurality of first wells having a first conductivity type and extending parallel to one another in the first horizontal direction,
wherein the second column comprises a plurality of second wells having the first conductivity type and extending parallel to one another in the first horizontal direction, and
wherein the interface column comprises a third well having the first conductivity type and connecting at least one first well of the plurality of first wells to at least one second well of the plurality of second wells.

6. The IC of claim 1, wherein the first column comprises a plurality of first power rails configured to provide a first supply voltage or a second supply voltage to the plurality of first cells, the plurality of first power rails extending parallel to one another in the first horizontal direction, and
wherein the interface column comprises:
a first power line connected to a first group of the plurality of first power rails and extending in the second horizontal direction, the first group of the plurality of first power rails being configured to provide the first supply voltage; and
a second power line connected to a second group of the plurality of first power rails and extending in the second horizontal direction, the second group of the plurality of first power rails being configured to provide the second supply voltage.

7. The IC of claim 6, wherein the second column comprises a plurality of second power rails configured to provide the first supply voltage or the second supply voltage to the plurality of second cells, the plurality of second power rails extending parallel to one another in the first horizontal direction, and
wherein the interface column comprises:
a third power line connected to a first group of the plurality of second power rails and extending in the second horizontal direction, the first group of the plurality of second power rails being configured to provide the first supply voltage; and
a fourth power line connected to a second group of the plurality of second power rails and extending in the second horizontal direction, the second group of the plurality of second power rails being configured to provide the second supply voltage.

8. The IC of claim 7, wherein the interface column comprises:
- at least one first conductive pattern extending in the first horizontal direction and connecting the first power line to the third power line; and
- at least one second conductive pattern extending in the first horizontal direction and connecting the second power line to the fourth power line.

9. The IC of claim 6, wherein the second column comprises a plurality of second power rails configured to provide the first supply voltage or the second supply voltage to the plurality of second cells, the plurality of second power rails extending parallel to one another in the first horizontal direction,
- wherein the first power line is connected to a first group of the plurality of second power rails, the first group of the plurality of second power rails being configured to provide the first supply voltage,
- wherein the second power line is connected to a second group of the plurality of second power rails, the second group of the plurality of second power rails being configured to provide the second supply voltage, and
- wherein the first power line and the second power line are formed in different conductive layers of the interface column.

10. The IC of claim 1, wherein the interface column comprises pre-placement cells.

11. The IC of claim 10, wherein the pre-placement cells comprise:
- at least one well tap configured to provide a first supply voltage to a well; and
- at least one substrate tap configured to provide a second supply voltage to a substrate.

12. An integrated circuit (IC) comprising:
- a first column comprising a plurality of first power rails, each first power rail of the plurality of first power rails being configured to provide a first supply voltage or a second supply voltage to a plurality of first cells and extending in a first horizontal direction at a first pitch;
- a second column comprising a plurality of second power rails configured to provide the first supply voltage or the second supply voltage to a plurality of second cells and extending in the first horizontal direction at a second pitch; and
- an interface column extending in a second horizontal direction perpendicular to the first horizontal direction between the first column and the second column,
- wherein the interface column comprises:
  - a first power line connected to a first group of the plurality of first power rails and extending in the second horizontal direction, the first group of the plurality of first power rails being configured to provide the first supply voltage;
  - a second power line connected to a first group of the plurality of second power rails and extending in the second horizontal direction, the first group of the plurality of second power rails being configured to provide the first supply voltage; and
  - at least one first conductive pattern extending in the first horizontal direction and connecting the first power line to the second power line.

13. The IC of claim 12, wherein the interface column further comprises a third power line connected to a second group of the plurality of first power rails and to a second group of the plurality of second power rails and extending in the second horizontal direction, the second group of the plurality of first power rails and the second group of the plurality of second power rails being configured to provide the second supply voltage.

14. The IC of claim 12, wherein the interface column further comprises:
- a third power line connected to a second group of the plurality of first power rails and extending in the second horizontal direction, the second group of the plurality of first power rails being configured to provide the second supply voltage;
- a fourth power line connected to a second group of the plurality of second power rails and extending in the second horizontal direction, the second group of the plurality of second power rails being configured to provide the second supply voltage; and
- at least one second conductive pattern extending in the first horizontal direction and connecting the third power line to the fourth power line.

15. The IC of claim 12, wherein each power rail of the plurality of first power rails and the plurality of second power rails comprises at least one of:
- a second conductive pattern buried in a substrate and extending in the first horizontal direction;
- a source/drain contact extending in the first horizontal direction; and
- a third conductive pattern extending in the first horizontal direction in a first wiring layer.

16. The IC of claim 12, wherein each of the first power line and the second power line comprises at least one of:
- a second conductive pattern buried in a substrate and extending in the second horizontal direction;
- a gate electrode extending in the second horizontal direction;
- a source/drain contact extending in the second horizontal direction; and
- a third conductive pattern extending in the second horizontal direction in a second wiring layer above a first wiring layer.

17. The IC of claim 12, wherein the at least one first conductive pattern comprises at least one of:
- a second conductive pattern buried in a substrate and extending in the first horizontal direction;
- a source/drain contact extending in the first horizontal direction;
- a third conductive pattern extending in the first horizontal direction in a first wiring layer;
- a fourth conductive pattern extending in the first horizontal direction in a third wiring layer above a second wiring layer above the first wiring layer; and
- a through silicon via connecting at least one of the first power line and the second power line to a fifth conductive pattern buried in the substrate,
- wherein the first power line is disposed in the first wiring layer and the second power line is disposed in the second wiring layer.

18. An integrated circuit (IC) comprising:
- a first column comprising a plurality of first cells aligned in a plurality of first rows, each first row of the plurality of first rows having a first width and extending in a first horizontal direction;
- a second column comprising a plurality of second cells aligned in a plurality of second rows, each second row of the plurality of second rows having a second width and extending in the first horizontal direction; and
- an interface column extending in a second horizontal direction perpendicular to the first horizontal direction between the first column and the second column, wherein the interface column comprises:
  at least one well tap configured to provide a first supply voltage to a well; and
  at least one substrate tap configured to provide a second supply voltage to a substrate.

19. The IC of claim 18, wherein the at least one substrate tap comprises:
  a plurality of first substrate taps aligned in the second horizontal direction; and
  a plurality of second substrate taps aligned in the second horizontal direction,
  wherein the at least one well tap is placed between the plurality of first substrate taps and the plurality of second substrate taps.

20. The IC of claim 18, wherein the interface column comprises at least one power switch cell configured to selectively cut off the first supply voltage or the second supply voltage provided to at least some cells of the plurality of first cells and the plurality of second cells.

* * * * *